(12) United States Patent
Baek et al.

(10) Patent No.: US 9,478,536 B2
(45) Date of Patent: Oct. 25, 2016

(54) SEMICONDUCTOR DEVICE INCLUDING FIN CAPACITORS

(71) Applicant: Samsung Electronics Co., Ltd., Suwon-si (KR)

(72) Inventors: Kang-hyun Baek, Seoul (KR); Sang-kyu Oh, Gwacheon-si (KR); Yongwoo Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/962,401

(22) Filed: Dec. 8, 2015

(65) Prior Publication Data

US 2016/0163694 A1    Jun. 9, 2016

Related U.S. Application Data

(60) Provisional application No. 62/089,483, filed on Dec. 9, 2014.

(30) Foreign Application Priority Data

Jul. 30, 2015 (KR) .................. 10-2015-0108160

(51) Int. Cl.
*H01L 27/06* (2006.01)
*H01L 27/092* (2006.01)
*H01L 29/78* (2006.01)

(52) U.S. Cl.
CPC ....... *H01L 27/0629* (2013.01); *H01L 27/0922* (2013.01); *H01L 29/785* (2013.01)

(58) Field of Classification Search
CPC ........... H01L 27/0629; H01L 27/0922; H01L 29/785
See application file for complete search history.

(56) References Cited

U.S. PATENT DOCUMENTS

| 6,947,275 | B1 | 9/2005 | Anderson et al. |
| 7,859,081 | B2 | 12/2010 | Doyle et al. |
| 8,067,792 | B2 | 11/2011 | Xiong et al. |
| 8,513,723 | B2 | 8/2013 | Booth, Jr. et al. |
| 8,581,320 | B1 | 11/2013 | Cheng et al. |
| 8,703,553 | B2 | 4/2014 | Cheng et al. |
| 8,841,185 | B2 | 9/2014 | Khakifirooz et al. |
| 8,860,148 | B2 | 10/2014 | Hu et al. |
| 8,987,823 | B2 | 3/2015 | Cheng et al. |
| 2008/0173913 | A1 | 7/2008 | Kojima |
| 2008/0237675 | A1* | 10/2008 | Doyle ............... H01L 27/10852 257/303 |
| 2008/0237678 | A1 | 10/2008 | Datta et al. |

FOREIGN PATENT DOCUMENTS

JP      6302781      4/1993

* cited by examiner

*Primary Examiner* — David Vu
(74) *Attorney, Agent, or Firm* — Onello & Mello, LLP

(57) ABSTRACT

A semiconductor device with fin capacitors is disclosed. The device includes a substrate including a first region and a second region; first and second active fins at the first and second regions, respectively, of the substrate; a device isolation layer in a first trench between the first active fins; first and second gate electrodes that cross the first and second active fins, respectively; a first dielectric layer between the first active fins and the first gate electrode to extend along the first gate electrode, and a second dielectric layer between the second active fins and the second gate electrode to extend along the second gate electrode. The first dielectric layer is spaced apart from a bottom surface of the first trench by the device isolation layer between the bottom surface of the first trench and the first dielectric layer. The second dielectric layer is in direct contact with a bottom surface of a second trench between the second active fins.

20 Claims, 50 Drawing Sheets

SEMICONDUCTOR DEVICE INCLUDING FIN CAPACITORS

CROSS-REFERENCE TO RELATED APPLICATIONS

This U.S. non-provisional patent application claims priority under 35 U.S.C. §119 from U.S. Provisional Patent application Ser. No. 62/089,483, filed on Dec. 9, 2014 in the United States Patent and Trademark Office, and Korean Patent Application No. 10-2015-0108160, filed on Jul. 30, 2015, in the Korean Intellectual Property Office, the entire contents of each of which is hereby incorporated by reference.

FIELD

Example embodiments of the inventive concept relate to a semiconductor device, and in particular, to a semiconductor device including fin capacitors.

BACKGROUND OF THE INVENTION

Due to their small-sized, multifunctional, and/or low-cost characteristics, semiconductor devices are often esteemed as important elements in the electronic industry. Semiconductor devices are typically classified into a memory device for storing data, a logic device for processing data, and a hybrid device including a combination of memory and logic elements. To meet the increased demand for electronic devices with fast speed and/or low power consumption, it is necessary to realize semiconductor devices having high reliability, high performance, and/or multiple functions. To satisfy these technical requirements, the complexity and/or integration density of semiconductor devices are being increased.

SUMMARY

Example embodiments of the inventive concept provide a semiconductor device, in which fin capacitors with higher capacitance are provided.

According to example embodiments of the inventive concept, a semiconductor device may include a substrate including a first region and a second region, first and second active fins at the first and second regions, respectively, of the substrate, a device isolation layer in a first trench between the first active fins; first and second gate electrodes that cross the first and second active fins, respectively, a first dielectric layer between the first active fins and the first gate electrode to extend along the first gate electrode, and a second dielectric layer between the second active fins and the second gate electrode to extend along the second gate electrode. The first dielectric layer may be spaced apart from a bottom surface of the first trench by the device isolation layer between the bottom surface of the first trench and the first dielectric layer. The second dielectric layer may be in direct contact with a bottom surface of a second trench between the second active fins.

In some embodiments, a top surface of the first dielectric layer on the first active fins may be at substantially a same level as that of the second dielectric layer on the second active fins.

In some embodiments, the substrate may comprise a shoulder portion positioned in the second region and between the second active fins, and wherein the shoulder portion may have a top surface that is coplanar with a bottom surface of the second trench.

In some embodiments, the second dielectric layer may cover top and side surfaces of at least one of the second active fins and a top surface of the shoulder portion In some embodiments, the first active fins, the first dielectric layer, and the first gate electrode may constitute a transistor, and the second active fins, the second dielectric layer, and the second gate electrode may constitute a capacitor.

In some embodiments, the device may further include first source/drain patterns at both sides of the first gate electrode and in the first active fins, and second source/drain patterns at both sides of the second gate electrode and in the second active fins.

In some embodiments, the device may further include an interlayered insulating layer covering the first and second active fins, the first and second source/drain patterns, and the first and second gate electrodes, and a contact connected to at least one of the first source/drain patterns through the interlayered insulating layer.

In some embodiments, the bottom surface of the first trench may be at a lower level than the bottom surface of the second trench.

In some embodiments, the bottom surface of the first trench may be at the same level as the bottom surface of the second trench.

In some embodiments, the bottom surface of the first trench may be at a higher level than the bottom surface of the second trench.

According to other example embodiments of the inventive concept, a semiconductor device may include a substrate including first active fins, second active fins, first shoulder portions between the first active fins, and second shoulder portions between the second active fins, first and second gate electrodes that cross the first and second active fins, respectively, a first dielectric layer between the first active fins and the first gate electrode, and a second dielectric layer between the second active fins and the second gate electrode. The first dielectric layer may extend along the first gate electrode and may be spaced apart from top surfaces of the first shoulder portions, and the second dielectric layer may extend along the second gate electrode to directly cover top surfaces of the second shoulder portions.

In some embodiments, a top surface of the first dielectric layer on the first active fins may be at substantially a same level as a top surface of the second dielectric layer on the second active fins.

In some embodiments, the first active fins may have a protruding structure between the first shoulder portions, the second active fins may have a protruding structure between the second shoulder portions, and the first and second active fins may be parallel to each other and may have a line-shaped structure.

In some embodiments, the first shoulder portions may be at substantially a same level as the second shoulder portions.

In some embodiments, the first shoulder portions may be positioned at a level different from the second shoulder portions.

According to other example embodiments of the inventive concept, a semiconductor device may comprise a substrate including a first region and a second region, a plurality of first fins at the first region of the substrate, a plurality of second fins at a second region of the substrate, a plurality of first trenches between the first fins, the first trenches each having a bottom surface, a plurality of second trenches between the second fins, the second trenches each having a bottom surface, wherein the bottom surfaces of the second trenches may be at a higher level than the bottom surfaces of the first trenches, a device isolation layer that fills the first trenches, and first and second gate electrodes that cross the first and second active fins, respectively.

In some embodiments, the device may further comprise a first dielectric layer between the first active fins and the first gate electrode and a second dielectric layer between the second active fins and the second gate electrode. The first dielectric layer may be spaced apart from a bottom surface of the first trench by the device isolation layer between the bottom surface of the first trench and the first dielectric layer. The second dielectric layer may be in direct contact with a bottom surface of a second trench between the second active fins.

In some embodiments, a top surface of the first dielectric layer on the first active fins may be at substantially a same level as that of the second dielectric layer on the second active fins.

In some embodiments, the substrate may comprise a shoulder portion positioned in the second region and between the second active fins, and wherein the shoulder portion may have a top surface that is coplanar with a bottom surface of the second trench.

In some embodiments, the first and second active fins are on metal-oxide-semiconductor field-effect transistor PMOS-FET and NMOSFET regions, respectively.

According to example embodiments of the inventive concept, a method of fabricating a semiconductor device may include forming first trenches defining first active fins therebetween on a first region of a substrate; forming second trenches defining second active fins therebetween on a second region of the substrate; forming a device isolation layers on the first region to selectively fill the first trenches; forming a first dielectric layer to cover the first active fins and the device isolation layers; forming a second dielectric layer to cover the second active fins and the second trenches; and forming a first gate electrode and a second gate electrode on the first dielectric layer and the second dielectric layer, respectively.

In some embodiments, the first active fins may be formed to have top surfaces at substantially a same level as top surfaces of the second active fins.

In some embodiments, the formation of the first and second trenches may include forming a first photoresist layer to selectively cover the second region and etching an upper portion of the first region of the substrate using the first photoresist layer as an etch mask. The first trenches may have bottom surfaces lower than those of the second trenches.

In some embodiments, the formation of the first and second trenches may include forming a second photoresist layer on the first region and etching an upper portion of the second region of the substrate using the second photoresist layer as an etch mask. The first trenches may be formed to have bottom surfaces higher than those of the second trenches.

In some embodiments, the formation of the device isolation layers may include forming a device isolation layers to fill the first and second trenches, forming a third photoresist layer on the first region, and removing the device isolation layers from the second trenches using the third photoresist layer as an etch mask.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
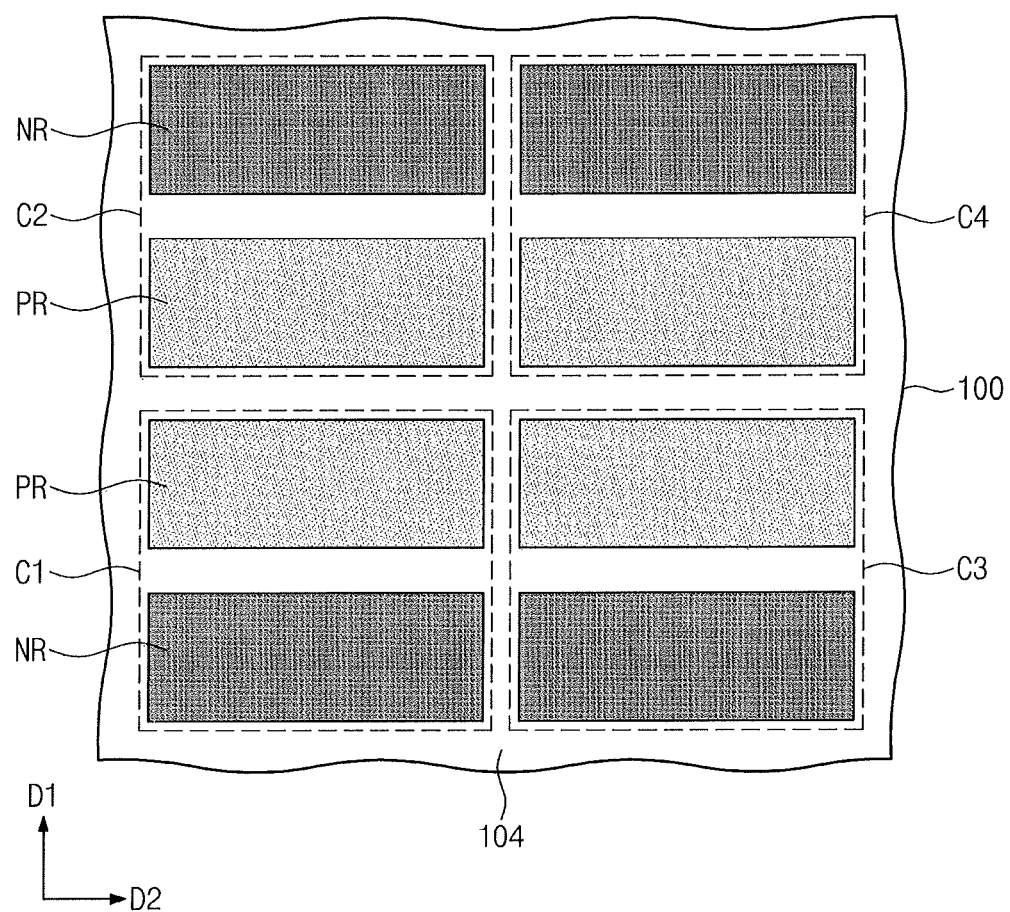
FIG. 1 is a plan view of a semiconductor device according to example embodiments of the inventive concept.

It should be noted that these figures are intended to illustrate the general characteristics of methods, structure and/or materials utilized in certain example embodiments and to supplement the written description provided below.

These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices shown and described according to various embodiments described herein may be interspersed among other devices depending on the functionality of the subject microelectronic device. In addition, microelectronic devices according to various embodiments described herein may be replicated in a third direction that may be orthogonal to the two different directions, i.e., first and second directions, to illustrate and provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a semiconductor device according to example embodiments of the inventive concept.

Referring to FIG. 1, a semiconductor device according to example embodiments of the inventive concept may include a plurality of logic cells C1, C2, C3, and C4 provided on a substrate 100. Each of the logic cells C1, C2, C3, and C4 may include a plurality of transistors. As an example, the semiconductor device may include a first logic cell C1, a second logic cell C2 spaced apart from the first logic cell C1 by a predetermined distance in a first direction D1, a third logic cell C3 spaced apart from the first logic cell C1 by a predetermined distance in a second direction D2 crossing the first direction D1, and a fourth logic cell C4 spaced apart from the second logic cell C2 by a predetermined distance in the second direction D2. Each of the logic cells C1, C2, C3, and C4 may include active regions spaced apart from each other by device isolation layers 104. Each of the logic cells C1, C2, C3, and C4 may include a metal-oxide-semiconductor field-effect transistor PMOSFET region PR and an NMOSFET region NR which are spaced apart from each other by the device isolation layers 104.

As an example, the PMOSFET and NMOSFET regions PR and NR may be spaced apart from each other in the first direction D1. The PMOSFET region PR of the first logic cell C1 may be disposed adjacent to the PMOSFET region PR of the second logic cell C2 in the first direction D1. In the following description, a term "logic cell" may refer to a unit circuit configured to perform a single logical operation. Further, the number of the logic cells may be variously changed, or otherwise be different, from that illustrated in the drawing.

Figure 2:
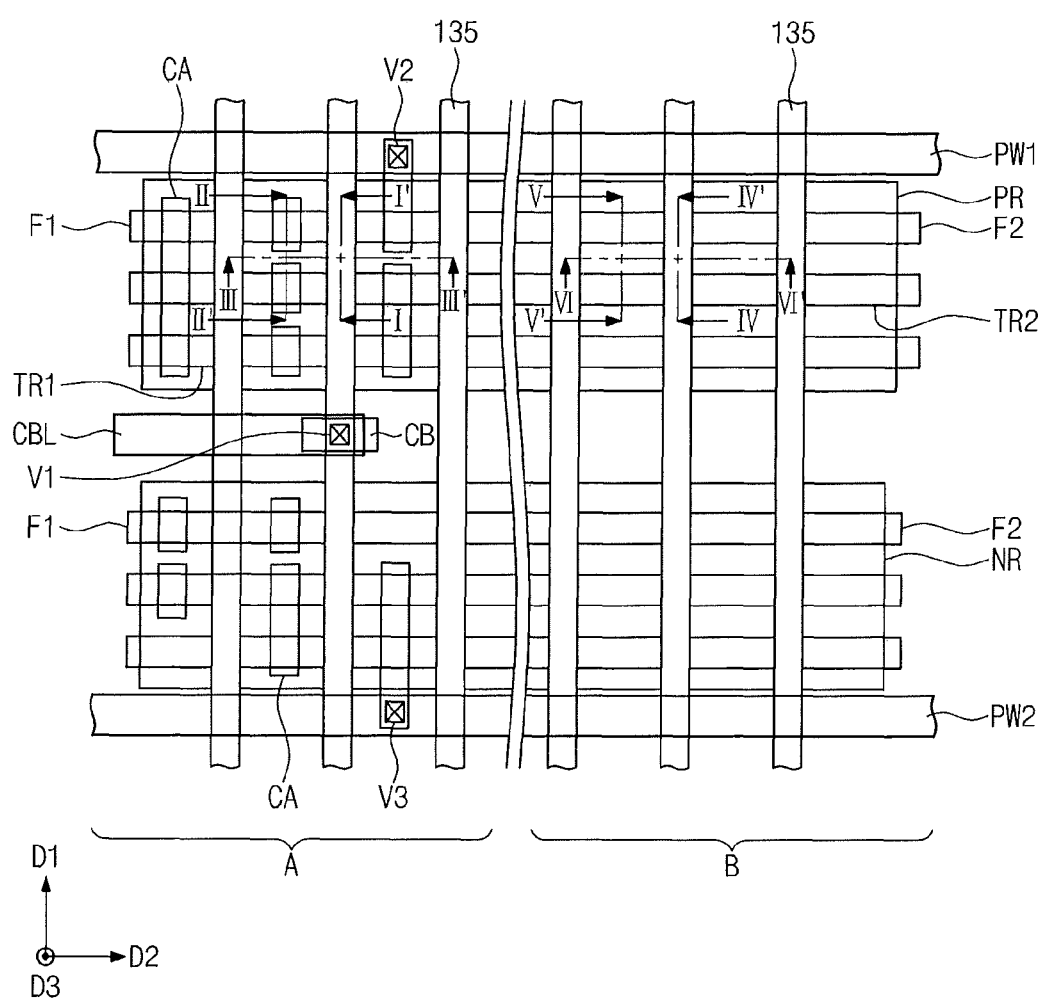
FIG. 2 is a plan view of elements of the semiconductor device of FIG. 1, according to example embodiments of the inventive concept.
Figure 3A:
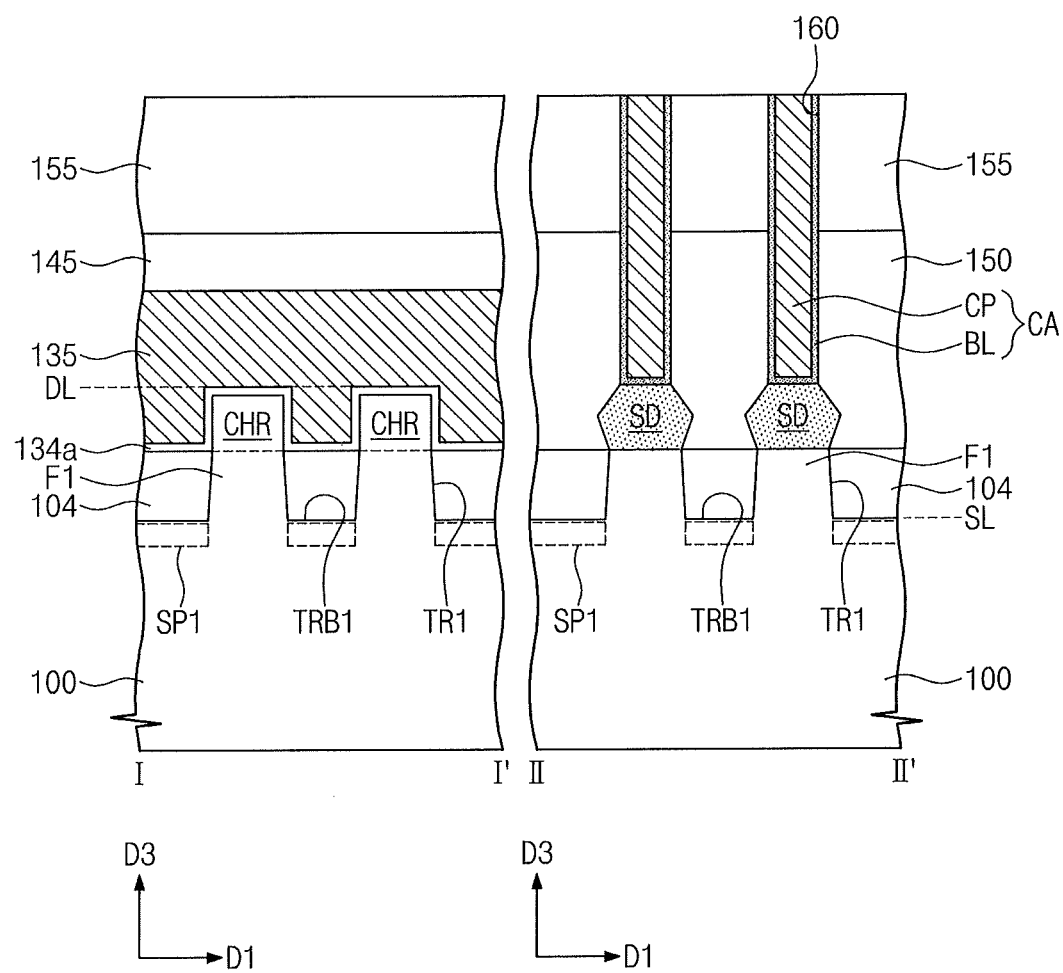
FIG. 3A is a sectional view illustrating vertical sections taken along lines I-I' and II-II' of FIG. 2.
Figure 3B:
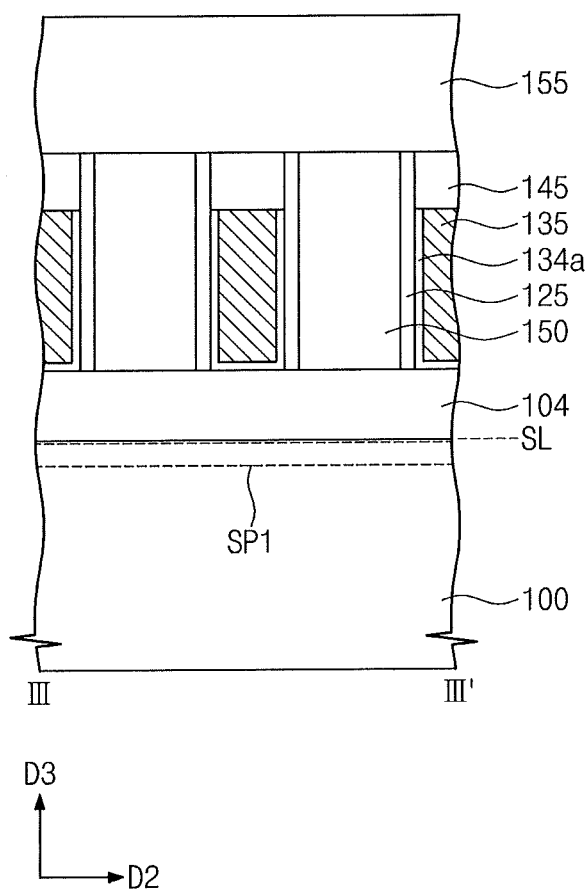
FIG. 3B is a sectional view taken along line III-III' of FIG. 2.
Figure 3C:
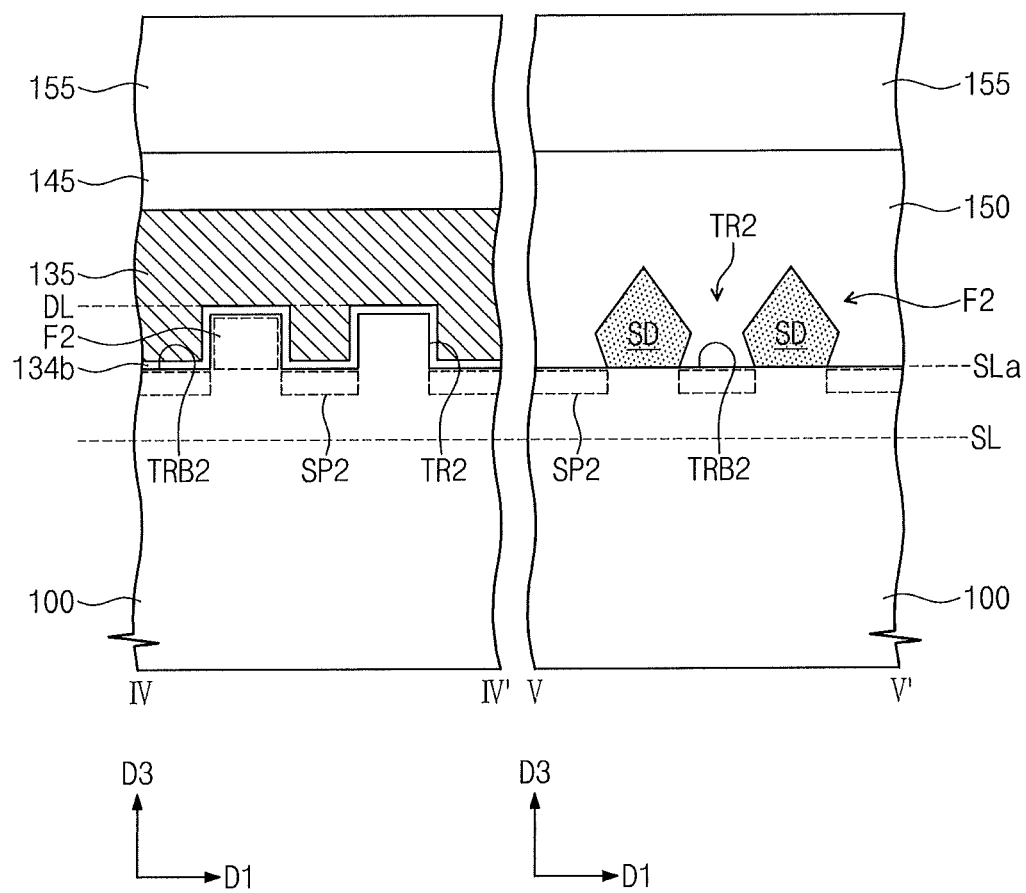
FIG. 3C is a diagram illustrating vertical sections taken along lines IV-IV' and V-V' of FIG. 2.
Figure 3D:
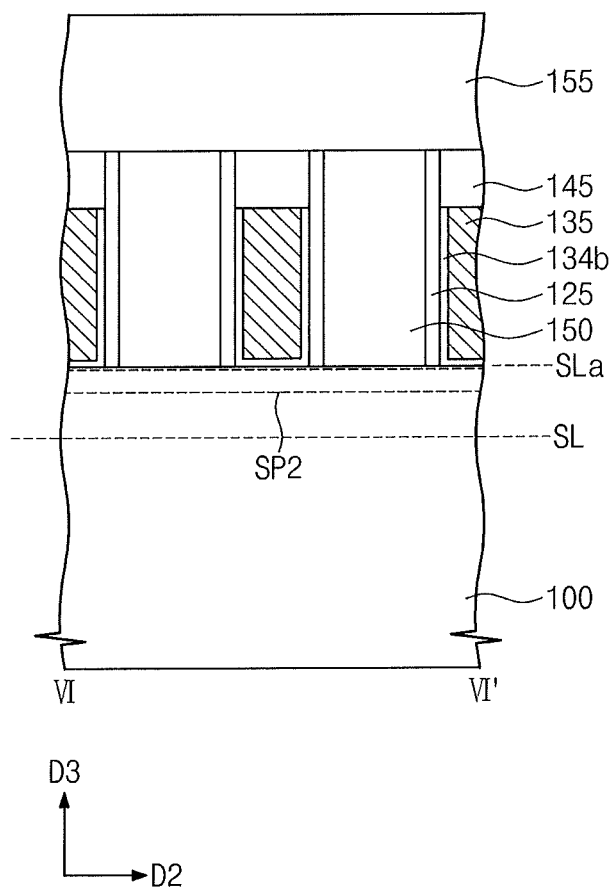
FIG. 3D is a sectional view taken along line VI-VI' of FIG. 2.

FIG. 2 is a plan view of elements of the semiconductor device of FIG. 1, according to example embodiments of the inventive concept. For example, FIG. 2 is a plan view illustrating the first logic cell C1 of FIG. 1. Hereinafter, various embodiments of the inventive concept will be described with reference to the first logic cell C1 of FIG. 1. Other logic cells may have substantially the same or similar structure as that of the first logic cell C1. FIG. 3A is a sectional view illustrating vertical sections taken along lines I-I' and II-II' of FIG. 2. FIG. 3B is a sectional view taken along line III-III' of FIG. 2. FIG. 3C is a diagram illustrating vertical sections taken along lines IV-IV' and V-V' of FIG. 2. FIG. 3D is a sectional view taken along line VI-VI' of FIG. 2.

Referring to FIGS. 2 and 3A through 3D, the semiconductor device may include a substrate 100 with a first region A and a second region B. In some embodiments, fin field effect transistors (Fin-FETs) may be on the first region A, and fin capacitors may be on the second region B. The substrate 100 may be a semiconductor substrate (e.g., of silicon, germanium, or silicon-germanium) or a compound semiconductor substrate.

The device isolation layers 104 may be on the first region A of the substrate 100 to define the PMOSFET and NMOSFET regions PR and NR, respectively. The device isolation layers 104 may be formed in a top portion of the substrate 100, for example, shown at FIG. 3B. In certain embodiments, the device isolation layers 104 may not be on the second region B, as will be described below. In example embodiments, the device isolation layers 104 may include an insulating material, such as silicon oxide or the like.

In the first region A, the PMOSFET and NMOSFET regions PR and NR may be spaced apart from each other in the first direction D1 parallel to a top surface of the substrate 100, by the device isolation layers 104 interposed therebetween. Although not shown, the device isolation layers 104 may have a larger depth between the PMOSFET and NMOSFET regions PR and NR than between active fins F1 and F2. As an example, although each of the PMOSFET and NMOSFET regions PR and NR is illustrated to be a single region, it may include a plurality of regions spaced apart from each other by the device isolation layers 104. In certain embodiments, the PMOSFET and NMOSFET regions PR and NR on the second region B may refer to two regions of the substrate 100, and here the device isolation layer 104 may not be interposed therebetween.

A plurality of active fins F1 and F2 may be on the PMOSFET and NMOSFET regions PR and NR to extend in the second direction D2 crossing the first direction D1. The active fins F1 and F2 may include first active fins F1 on the first region A and second active fins F2 on the second region B. The first and second active fins F1 and F2 may be arranged along the first direction D1. In some embodiments, the first and second active fins F1 and F2 have a first conductivity type.

Hereinafter, the first active fins F1 on the first region A will be described in more detail. On the first region A, the device isolation layers 104 may be at both sides of each of the first active fins F1. In other words, the device isolation layers 104 may define the first active fins F1. In some embodiments, three first active fins F1 may be at each of the PMOSFET and NMOSFET regions PR and NR as shown in FIG. 2, but example embodiments of the inventive concept may not be limited thereto.

The first active fins F1 may have a structure that protrudes from the substrate 100 in a third direction D3 perpendicular to a top surface of the substrate 100. For example, the first active fins F1 may include upper portions protruding through regions between the device isolation layers 104. The upper portion of each of the first active fins F1 may include source/drain patterns SD and a channel region CHR interposed between the source/drain patterns SD.

First trenches TR1 may be between the first active fins F1. The device isolation layers 104 may fill lower regions of the first trenches TR1. The substrate 100 may include first shoulder portions SP1 positioned under the first trenches TR1. The first shoulder portions SP1 may include upper portions of the substrate 100. When viewed in a plan view, the first shoulder portions SP1 may be positioned between the first active fins F1 and may be overlapped with the first trenches TR1. As an example, the first active fins F1 may be protruding portions of the substrate 100 positioned between the first shoulder portions SP1, in particular, each first active fin F1 is between two neighboring shoulder portions SP1.

Hereinafter, a vertical position of bottom surfaces TRB1 of the first trenches TR1 may be referred to as a "reference level SL". Top surfaces of the first shoulder portions SP1 may be coplanar with the bottom surfaces TRB1 of the first trenches TR1, and thus, they may be positioned at the reference level SL.

Next, the second active fins F2 of the second region B will be described in more detail. The second active fins F2 may be formed from portions of the substrate 100 and may have a structure that protrudes from the substrate 100 in the third direction D3. Unlike the first region A, the device isolation layers 104 may not be formed between the second active fins F2. Each of the second active fins F2 may include source/drain patterns SD. In some embodiments, three second active fins F2 may be on each of the PMOSFET and NMOSFET regions PR and NR as shown in FIG. 2, but example embodiments of the inventive concept may not be limited thereto.

A plurality of second trenches TR2 may be between the second active fins F2. The substrate 100 may include second shoulder portions SP2 positioned under the second trenches TR2. The second shoulder portions SP2 may include upper portions of the substrate 100. When viewed in a plan view, the second shoulder portions SP2 may be positioned between the second active fins F2 and may overlap the second trenches TR2. As an example, the second active fins F2 may be protruding portions of the substrate 100, in particular, protruding from a top surface of the substrate 100, and positioned between the second shoulder portions SP2.

The second trenches TR2 may have bottom surfaces TRB2 at a first level SLa. Top surfaces of the second shoulder portions SP2 may be coplanar with the bottom surfaces TRB2 of the second trenches TR2, and thus, they may be at the first level SLa. In some embodiments, the first level Sla may be higher than the reference level SL. In other words, the bottom surfaces TRB2 of the second trenches TR2 may be at a higher level than the bottom surfaces TRB1 of the first trenches TR1. However, in certain embodiments, the top surfaces of the first and second active fins F1 and F2 may be at substantially the same level.

In some embodiments, gate electrodes 135 may be on the substrate 100 to cross the first and second active fins F1 and F2. As an example, each of the gate electrodes 135 on the first region A may overlap at least one of the channel regions CHR of the first active fins F1, when viewed in a plan view. The gate electrodes 135 may cross the first and second active fins F1 and F2 and have a line-shaped structure extending in the first direction D1. Furthermore, the gate electrodes 135 on the first region A may horizontally extend to cross the device isolation layers 104. The gate electrodes 135 on the second region B may horizontally extend to cross the second shoulder portions SP2.

In some embodiments, the gate electrodes 135 may be formed of or include at least one of conductive metal nitrides, e.g., titanium nitride or tantalum nitride, or metals, e.g., titanium, tantalum, tungsten, copper, or aluminum.

A pair of gate spacers 125 may be on both sidewalls of the gate electrode 135. The gate spacers 125 may extend along the gate electrodes 135 in the first direction D1. A top surface of each of the gate spacers 125 may be at a higher level than a top surface of the gate electrode 135. Furthermore, the top surface of each of the gate spacers 125 may be coplanar with that of a first interlayered insulating layer 150, described below. The gate spacers 125 may include at least one of $SiO_2$, SiCN, SiCON, or SiN. Alternatively, the gate spacers 125 may be a multi-layer structure including at least one of $SiO_2$, SiCN, SiCON, or SiN.

A first dielectric layer 134a may be positioned between the gate electrodes 135 and the first active fins F1, and a second dielectric layer 134b may be positioned between the gate electrodes 135 and the second active fins F2. Each of the first and second dielectric layers 134a and 134b, respectively, may extend along a bottom surface of the gate electrode 135.

The first dielectric layer 134a may cover top and side surfaces of the channel regions CHR of the first active fins F1. The gate electrode 135 in turn may cover the first dielectric layer 134a. The first dielectric layer 134a may extend horizontally to at least partially cover the top surfaces of the device isolation layers 104. In other words, the first dielectric layer 134a may be spaced apart from the bottom surfaces TRB1 of the first trench TR1 or from the top surfaces of the first shoulder portions SP1 by the device isolation layers 104 interposed therebetween.

As shown in FIG. 3C, the second dielectric layer 134b may cover top and side surfaces of the second active fins F2. In addition, the second dielectric layer 134b may extend horizontally to at least partially cover the top surfaces of the second shoulder portions SP2. In other words, the second dielectric layer 134b may cover inner surfaces of the second trenches TR2 including the bottom surfaces TRB2.

A top surface of the first dielectric layer 134a on the first active fins F1 may be positioned at substantially the same level (hereinafter, DL) as that of the second dielectric layer 134b on the second active fins F2. This is because the first and second active fins F1 and F2 may have top surfaces that are substantially coplanar with each other. In addition, each of the first and second dielectric layers 134a and 134b may extend into regions between the gate electrode 135 and the gate spacers 125 adjacent thereto.

The first and second dielectric layers 134a and 134b may be formed of or include at least one of high-k dielectric materials. For example, the first and second dielectric layers 134a and 134b may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In certain embodiments, although not shown, the width (in the second direction D2) of the gate electrodes 135 at the first region A may be different from that of the gate electrodes 135 at the second region B. For example, the gate electrodes 135 at the second region B may be wider than the gate electrodes 135 at the first region A. In cases where the gate electrodes 135 at the second region B have an increased width relative to the gate electrodes 135 at the first region A, an area of the second dielectric layer 134b facing the gate electrodes 135 may be increased. This may make it possible for the capacitors to have an increased electric capacitance.

Gate capping layers 145 may be disposed on the gate electrodes 135, respectively. The gate capping layers 145 may extend along the gate electrodes 135 or in the first direction D1. The gate capping layers 145 may include a material having an etch selectivity with respect to first and second interlayered insulating layers 150 and 155 to be described below. For example, the gate capping layers 145 may include at least one of SiON, SiCN, SiCON, or SiN.

Source/drain patterns SD may be at both sides of each gate electrode 135, and on the first and second active fins F1 and F2. The source/drain patterns SD may be formed of epitaxial patterns, which are epitaxially grown from the first and second active fins F1 and F2. As an example, in the case of the first active fins F1, the top surfaces of the channel regions CHR may be positioned at a higher level than the bottom surfaces of the source/drain patterns SD. The top surfaces of the source/drain patterns SD may be positioned at the same level as, or a higher level than, the top surfaces of the channel regions CHR. Thus, in some embodiments, the source/drain patterns SD have a height in the third direction D3 that is higher than a height of the channel regions CHR in the third direction D3.

The source/drain patterns SD may include a semiconductor element different from those of the substrate 100. As an example, the source/drain patterns SD may be formed of or include a semiconductor material having a lattice constant that is different from, for example, greater or smaller than, the substrate 100. This may make it possible to exert a compressive stress or a tensile stress with respect to the channel regions CHR. In the case where the substrate 100 is a silicon wafer, the source/drain patterns SD may be formed of or include a silicon-germanium (e.g., e-SiGe) or germanium layer or the like. In this case, the source/drain patterns SD may exert a compressive stress with respect to the channel regions CHR (preferably, of PMOS field effect transistors). As another example, in the case where the substrate 100 is a silicon wafer, the source/drain patterns SD may be formed of or include a silicon-carbide (SiC) layer or the like. In this case, the source/drain patterns SD may exert a tensile stress with respect to the channel regions CHR (preferably, of NMOS field effect transistors). The compressive or tensile stress to be exerted on the channel regions CHR by the source/drain patterns SD may make it possible for carriers in the channel regions CHR to have an increased mobility when the field effect transistors are operated. The source/drain patterns SD may have a second conductivity type that is different from that of the first and second active fins F1 and F2.

In some embodiments, the source/drain patterns SD of the first and second regions A and B may be formed at the same time, e.g., formed by the same process. However, example embodiments of the inventive concept may not be limited thereto; for example, although not shown, the source/drain patterns SD may not be formed at the second region B. Operation of the fin capacitors is substantially independent of the presence or absence of the source/drain patterns SD, and thus, it is possible to omit the source/drain patterns SD from the second region B for the fin capacitors.

A first interlayered insulating layer 150 may be provided on the substrate 100. The first interlayered insulating layer 150 may cover the source/drain patterns SD. The first interlayered insulating layer 150 may also cover a side of the sidewall spacers 125, for example, sandwiching the sidewall spacers 125 between the first interlayered insulating layer 150 and a dielectric layer 134a, b, which in turn extends along a sidewall of a corresponding gate electrode 135. In some embodiments, the top surfaces of the device isolation layers 104 on the first region A may include opened portions not otherwise covered with the first dielectric layer 134a. The first interlayered insulating layer 150 may cover the opened portions of the device isolation layers 104 not otherwise covered with the first dielectric layer 134a. Furthermore, the top surfaces of the second shoulder portions SP2 on the second region B may include opened portions not otherwise covered with the second dielectric layer 134b. The first interlayered insulating layer 150 may cover the opened portion of the second shoulder portions SP2 not otherwise covered with the second dielectric layer 134b.

The first interlayered insulating layer 150 may have a top surface that is substantially coplanar with top surfaces of the gate capping layers 145 and the gate spacers 125, respectively. The second interlayered insulating layer 155 may be on the first interlayered insulating layer 150 to cover the gate capping layers 145.

In addition, contacts CA may be at both sides of each of the gate electrodes 135 and may be electrically connected to the source/drain patterns SD through the first and second interlayered insulating layers 150 and 155. For example, the contacts CA may be on the first region A. Each of the contacts CA may be connected to at least one corresponding one source/drain pattern SD. However, embodiments of the inventive concept may not be limited thereto. Each of the contacts CA may include a conductive pillar CP and a barrier layer BL enclosing the conductive pillar CP. The barrier layer BL may cover side and bottom surfaces of the conductive pillar CP. The conductive pillar CP may be formed of or include a metallic material, e.g., tungsten. The barrier layer BL may be formed of or include at least one of metallic materials or metal nitrides, e.g., Ti/TiN.

Although not shown, metal silicide layers may be respectively interposed between the source/drain patterns SD and the contacts CA. In other words, the contacts CA may be electrically connected to the source/drain patterns SD via the metal silicide layers. The metal silicide layers may be formed of or include at least one of metal-silicide materials, e.g., titanium silicide, tantalum silicide, or tungsten silicide.

Referring back to FIG. 2, a gate contact CB and a conductive line CBL may be positioned on one of the gate electrodes 135 at the first region A. A first via V1 may be disposed between the gate contact CB and the conductive line CBL. The conductive line CBL may be electrically connected to the one of the gate electrodes 135 through the first via V1 and the gate contact CB, and may serve as a current path for applying signals to the one of the gate electrodes 135.

The first logic cell C1 may include a first wire PW1 near an outer edge of the PMOSFET region PR and a second wire PW2 near an outer edge of the NMOSFET region NR. As an example, the first wire PW1 on the PMOSFET region PR may serve as a current path for transmitting a drain voltage Vdd, e.g., a power voltage. The second wire PW2 on the NMOSFET region NR may serve as a current path for transmitting a source voltage Vss, e.g., a ground voltage.

Referring back to FIGS. 1 and 2, the first and second wires PW1 and PW2 may extend in a parallel direction relative to the second direction D2 and may be shared by a plurality of logic cells adjacent to each other in the second direction D2. As an example, the first wire PW1 may be shared by the first logic cell C1 and the third logic cell C3. Furthermore, the first wire PW1 may be shared by multiple regions, for example, the PMOSFET regions PR of the first and second logic cells C1 and C2, respectively.

In some embodiments, a second via V2 may be on one of the contacts CA, for example, at or near the first wire PW1. Accordingly, the source/drain pattern SD connected to the one of the contacts CA may be electrically connected to the first wire PW1 through the one of the contacts CA and the second via V2. Similarly, the source/drain pattern SD on the NMOSFET region NR may be electrically connected to the second wire PW2 through the one of the contacts CA and a third via V3 at or near the second wire PW2.

In some embodiments, at the second region B, the second dielectric layer 134b may cover not only the top surfaces of the second active fins F2 but also the top surfaces of the second shoulder portions SP2. The second region B for the fin capacitors may have a different structure from the first region A for the fin-FETs. If the second active fins F2 and the second dielectric layer 134b on the second region B have the same structures as the first active fins F1 and the first dielectric layer 134a on the first region A, then only the second dielectric layer 134b positioned on the second active fins F2 may be used for charge storing of the fin capacitors. However, according to the present embodiments, the second dielectric layer 134b of the second region B may be in direct contact with the second shoulder portions SP2, i.e., upper portions of the substrate 100. Thus, the second dielectric layer 134b on the second shoulder portions SP2 may be further used for the charge storing of the fin capacitors. Accordingly, it is possible to increase an active area of the second dielectric layer 134b contributing to the charge storing and thereby to increase capacitance of the fin capacitors.

FIGS. 4, 6, 8, 10, and 13 are plan views illustrating a method of fabricating a semiconductor device according to example embodiments of the inventive concept. FIGS. 5A and 5B are sectional views illustrating vertical sections taken along lines I-I', II-II', and III-III' of FIG. 4. FIGS. 7A, 7B, 7C, and 7D are sectional views illustrating vertical sections taken along lines I-I', II-II', III-III', IV-IV', V-V', and VI-VI' of FIG. 6. FIGS. 9A, 9B, 9C, and 9D are sectional views illustrating vertical sections taken along lines I-I', II-II', III-III', IV-IV', V-V', and VI-VI' of FIG. 8. FIGS. 11A, 11B, 11C, and 11D are sectional views illustrating vertical sections taken along lines I-I', II-II', III-III', IV-IV', V-V', and VI-VI' of FIG. 10. FIGS. 12A, 12B, 12C, and 12D are sectional views illustrating vertical sections taken along lines I-I', II-II', III-III', IV-IV', V-V', and VI-VI' of FIG. 10. FIGS. 14A, 14B, 14C, and 14D are sectional views illustrating vertical sections taken along lines I-I', II-II', III-III', IV-IV', V-V', and VI-VI' of FIG. 13.

Figure 4:
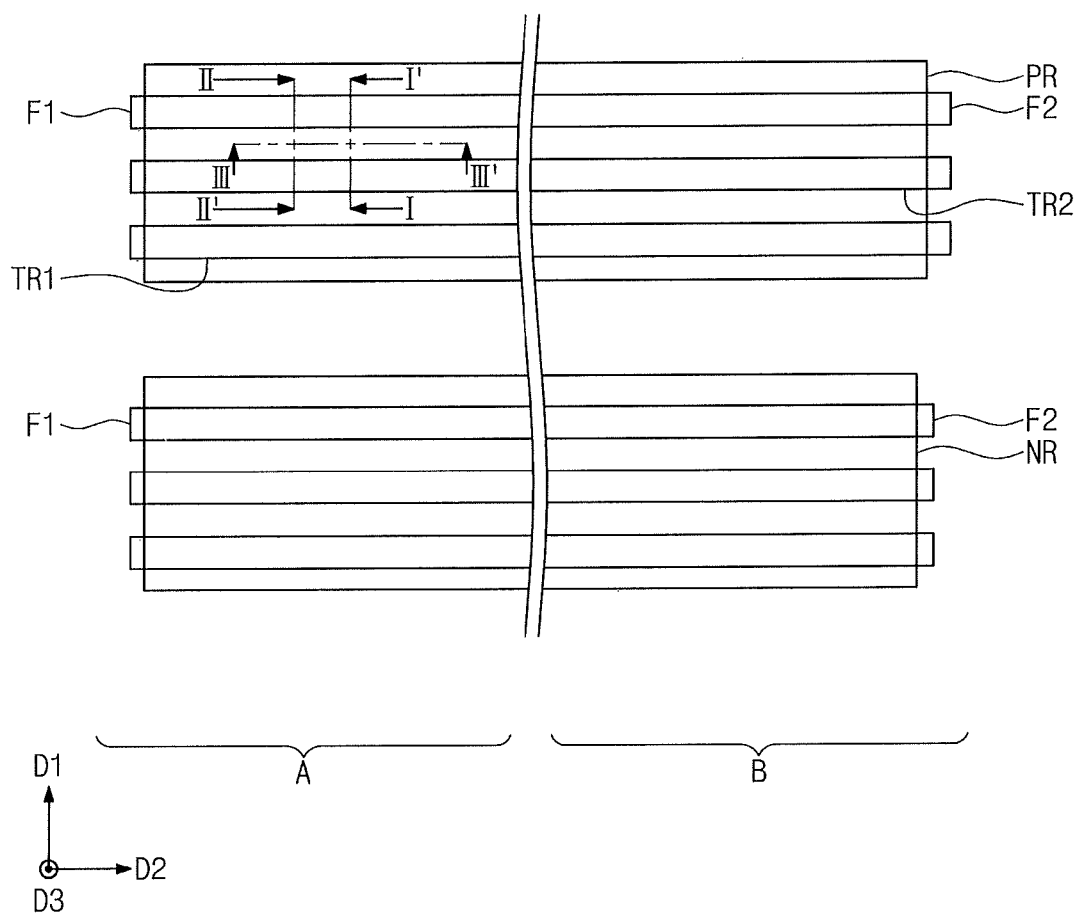
FIGS. 4, 6, 8, 10, and 13 are plan views illustrating a method of fabricating a semiconductor device according to example embodiments of the inventive concept.
Figure 5A:
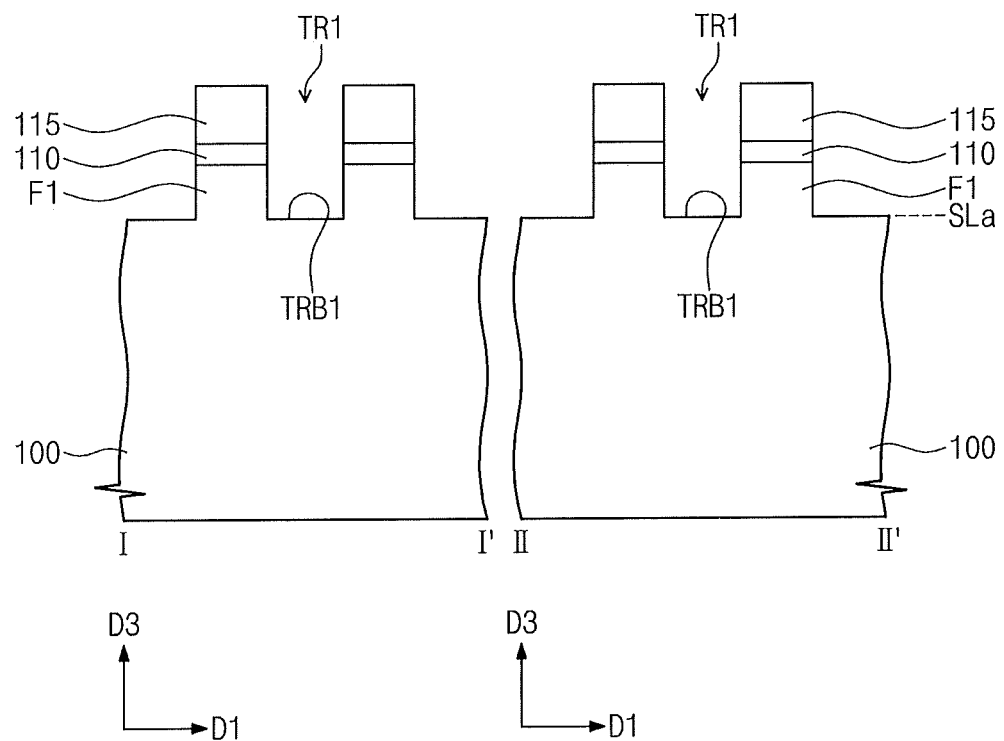
FIGS. 5A and 5B are sectional views illustrating vertical sections taken along lines I-I', II-II', and III-III' of FIG. 4.
Figure 5B:
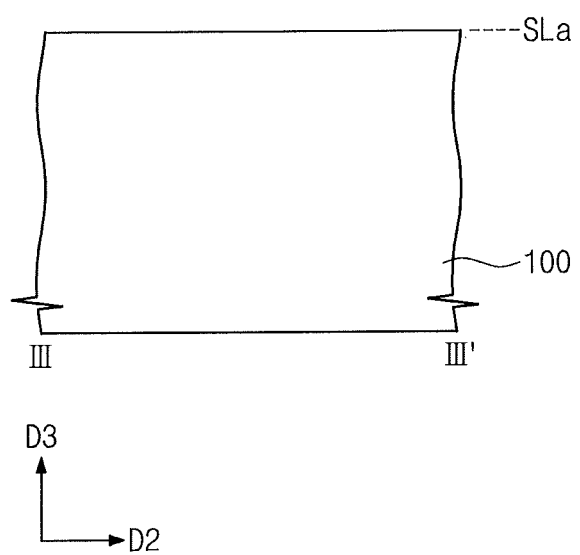
Figure 6:
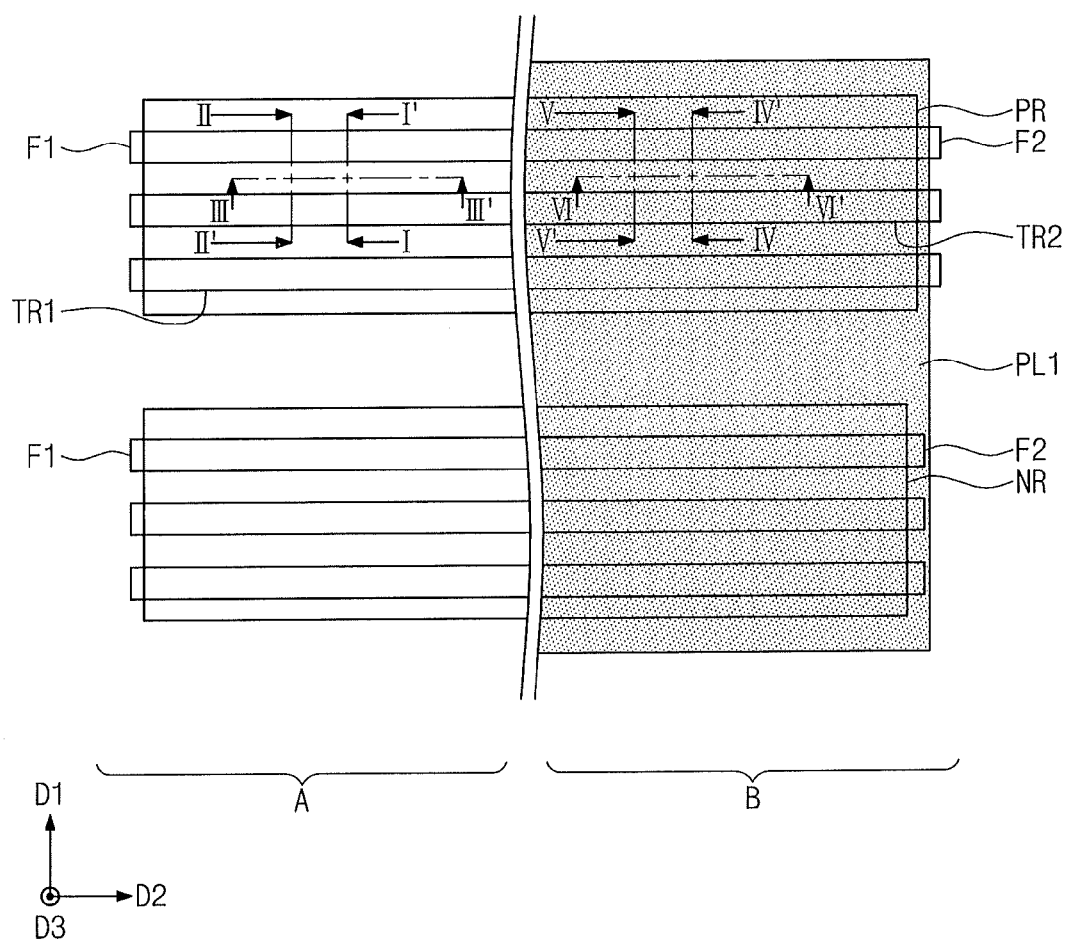
Figure 7A:
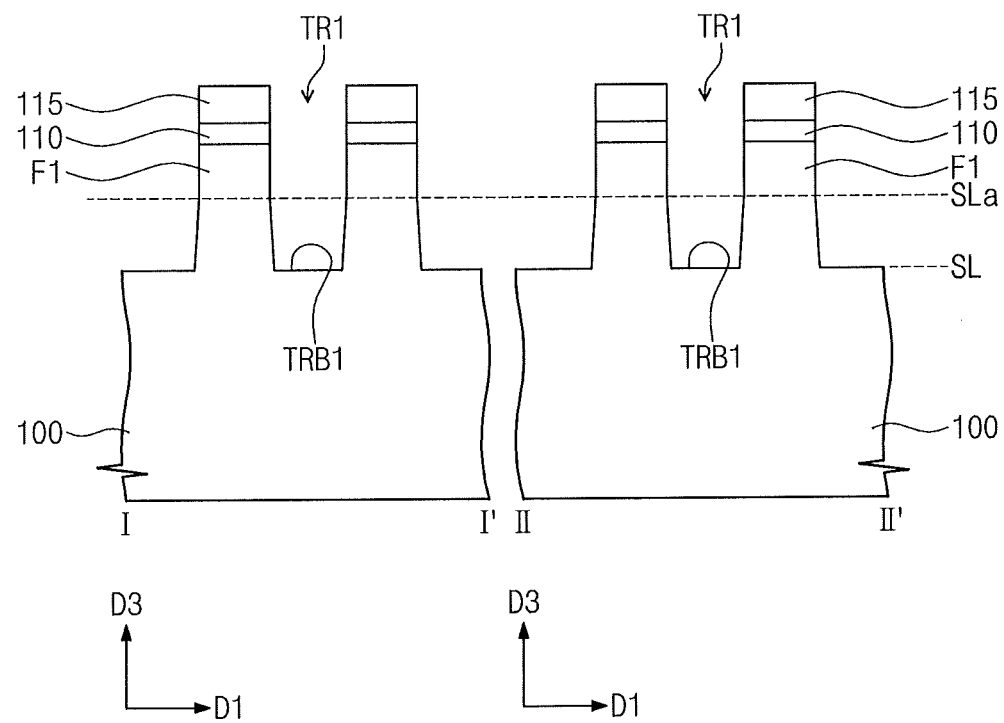
FIGS. 7A, 7B, 7C, and 7D are sectional views illustrating vertical sections taken along lines I-I', II-II', III-III', IV-IV', V-V', and VI-VI' of FIG. 6.
Figure 7B:
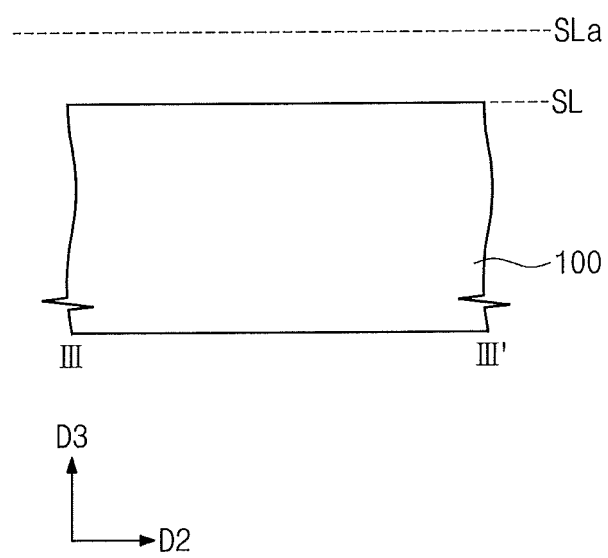
Figure 7C:
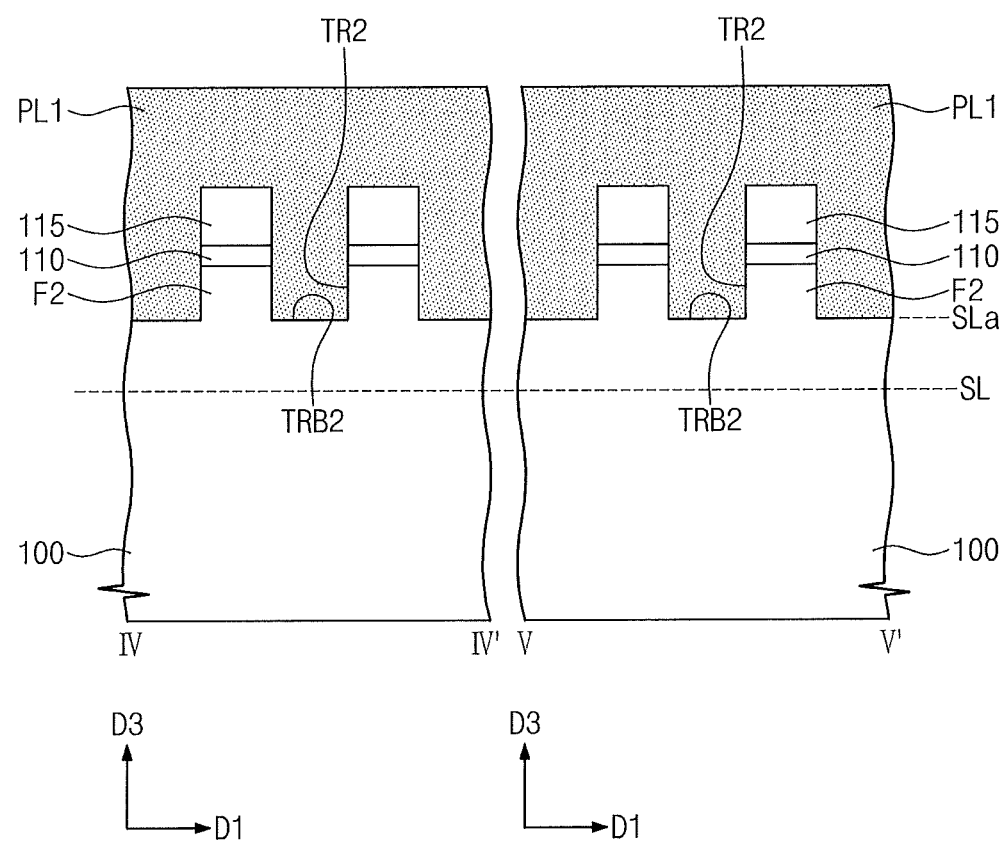
Figure 7D:
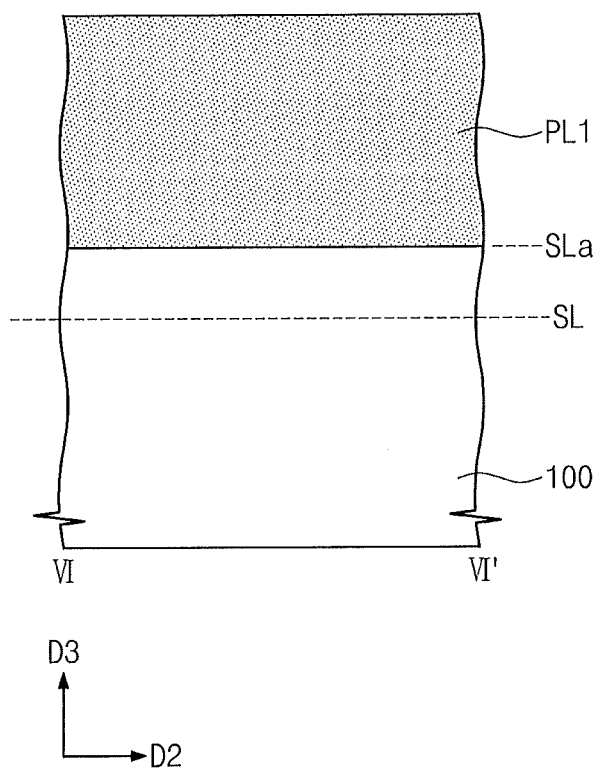
Figure 8:
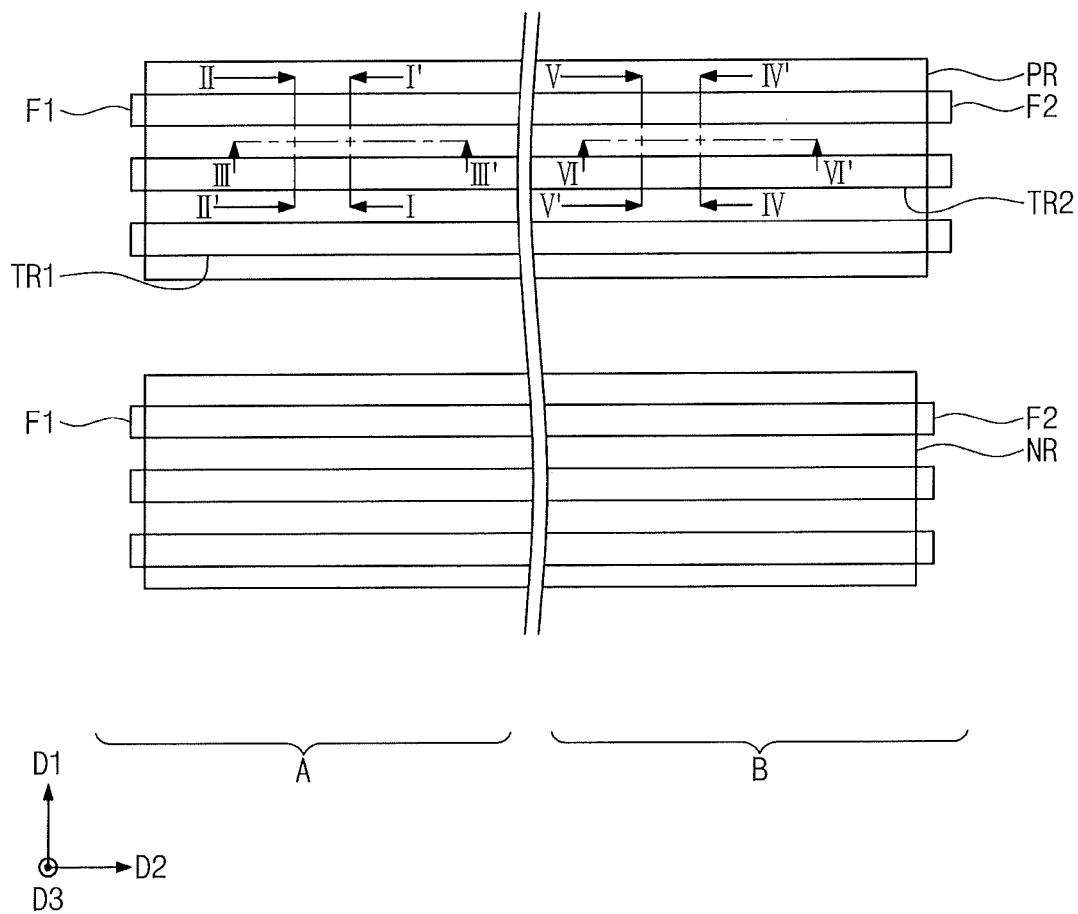
Figure 9A:
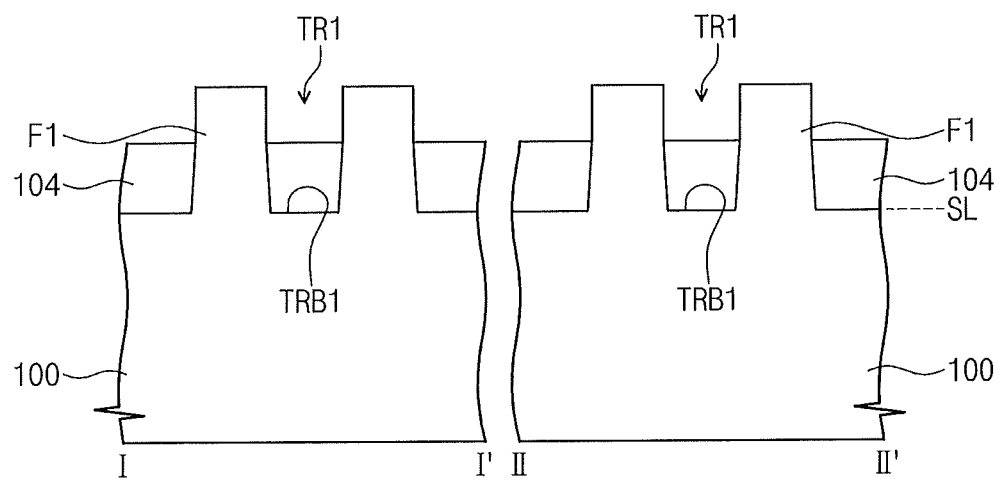
FIGS. 9A, 9B, 9C, and 9D are sectional views illustrating vertical sections taken along lines I-I', II-II', III-III', IV-IV', V-V', and VI-VI' of FIG. 8.
Figure 9B:
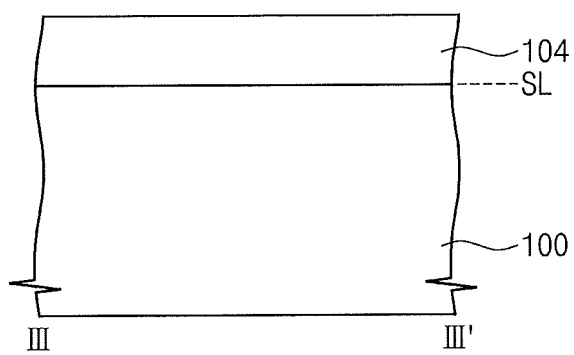
Figure 9C:
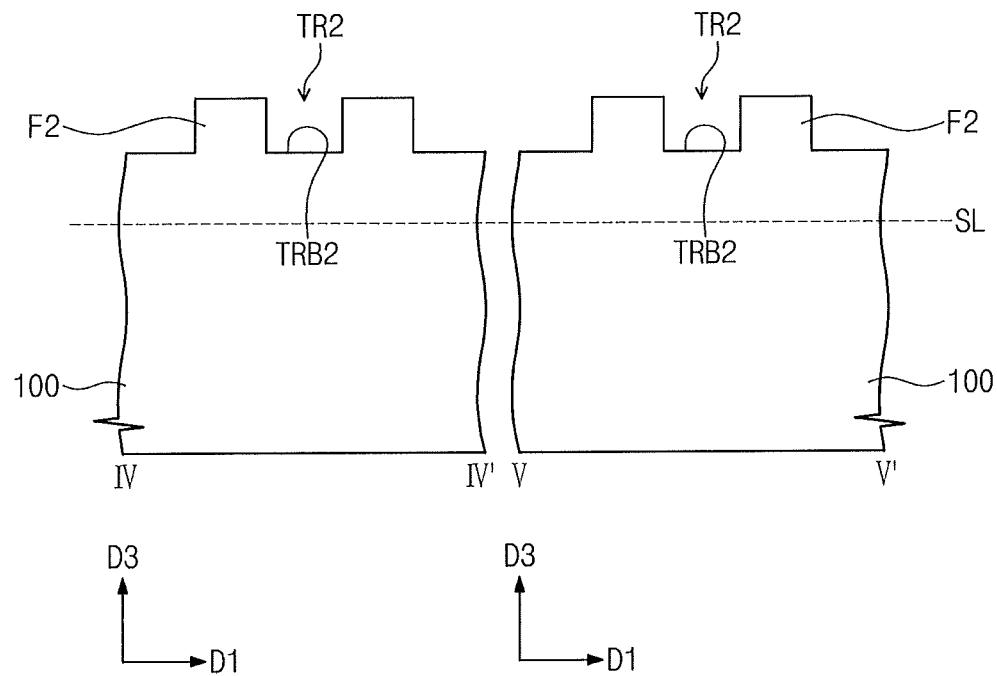
Figure 9D:
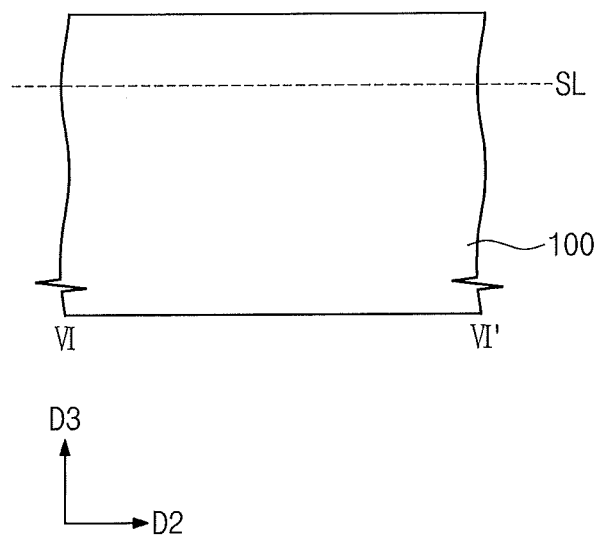
Figure 10:
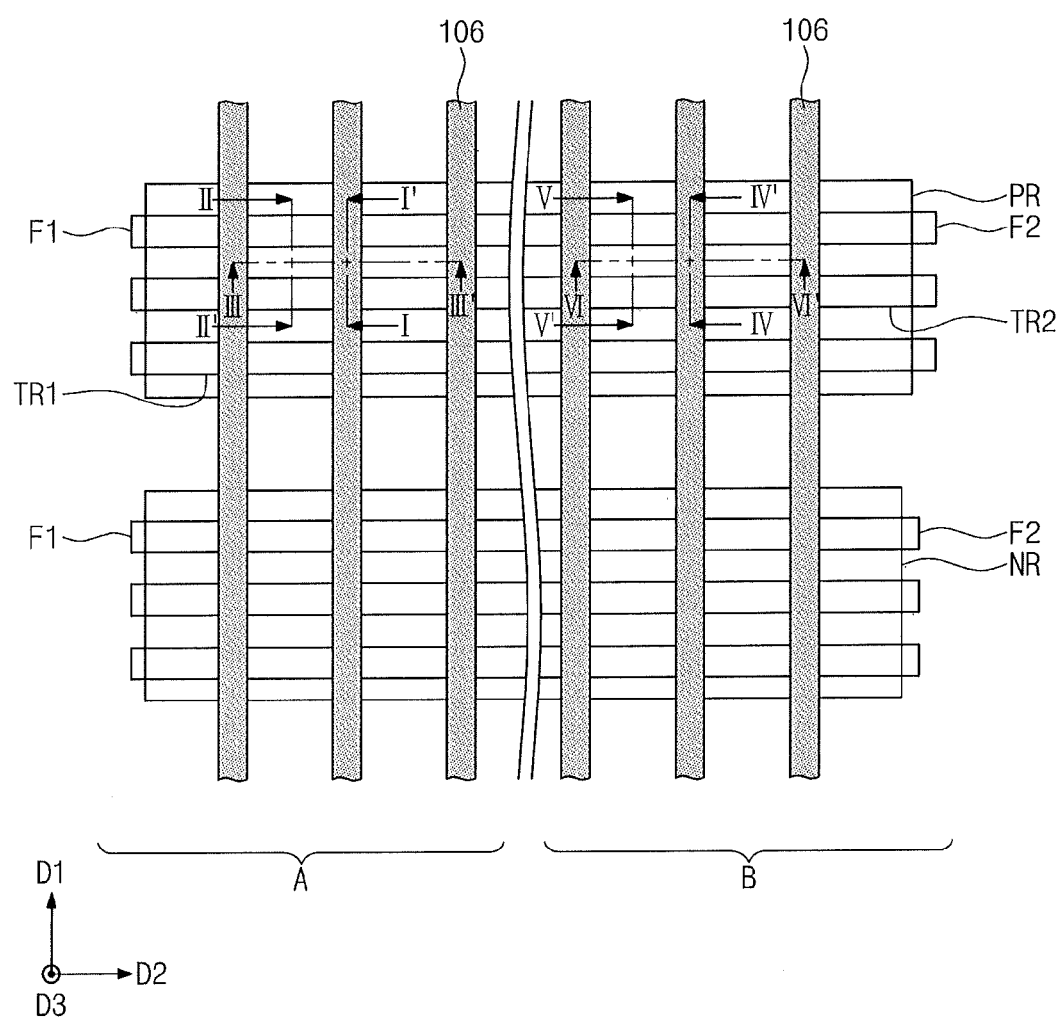
Figure 11A:
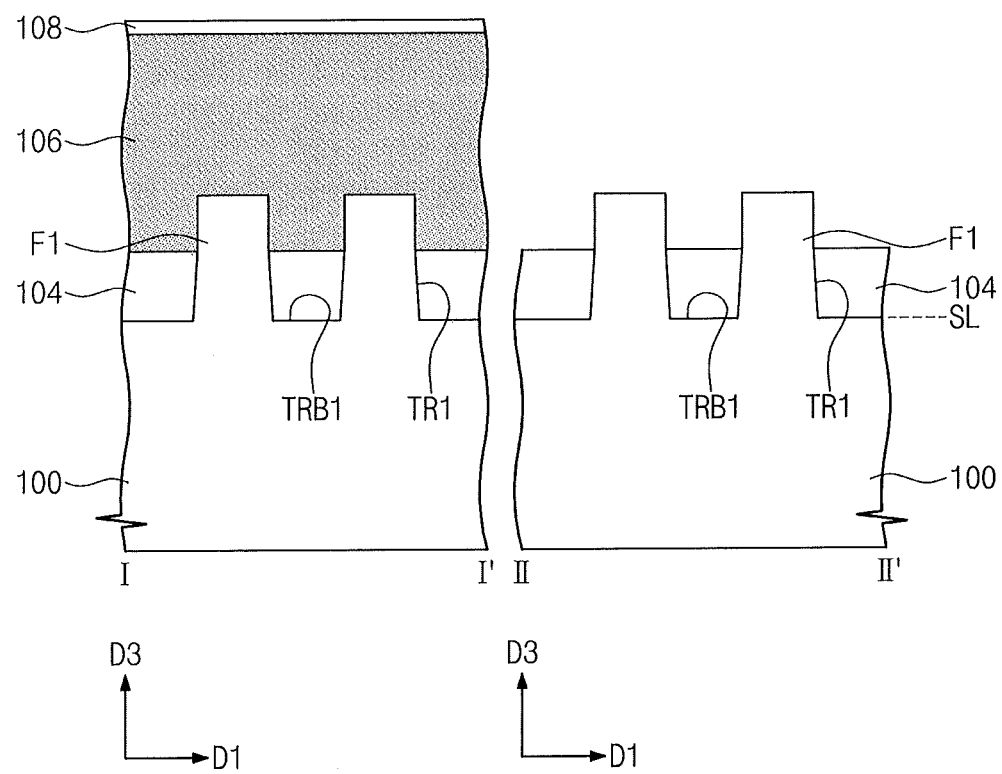
FIGS. 11A, 11B, 11C, and 11D are sectional views illustrating vertical sections taken along lines I-I', II-II', III-III', IV-IV', V-V', and VI-VI' of FIG. 10.
Figure 11B:
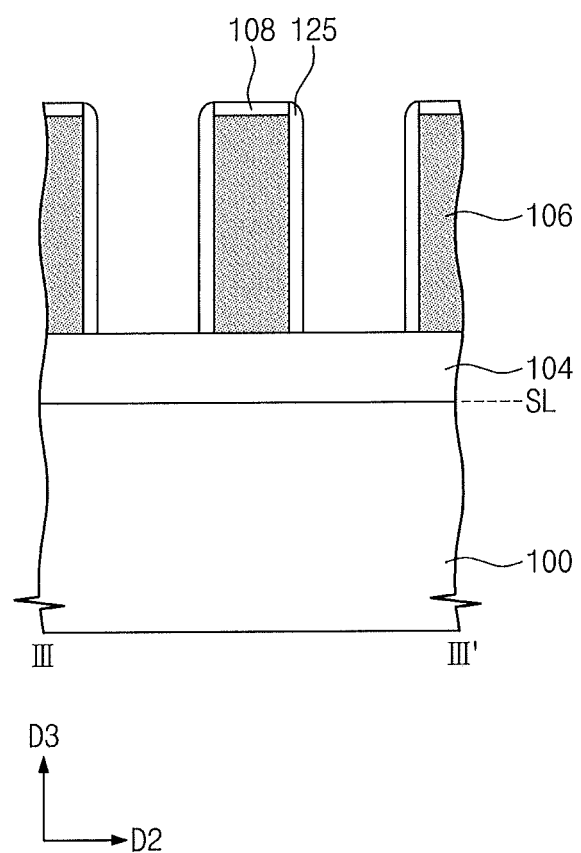
Figure 11C:
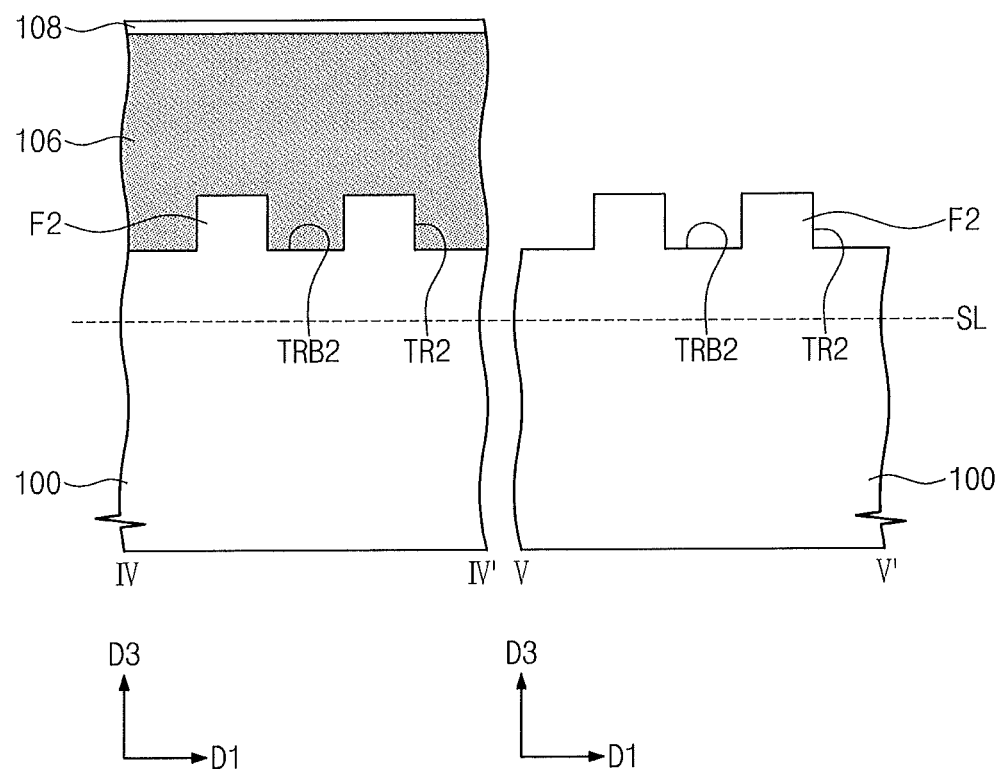
Figure 11D:
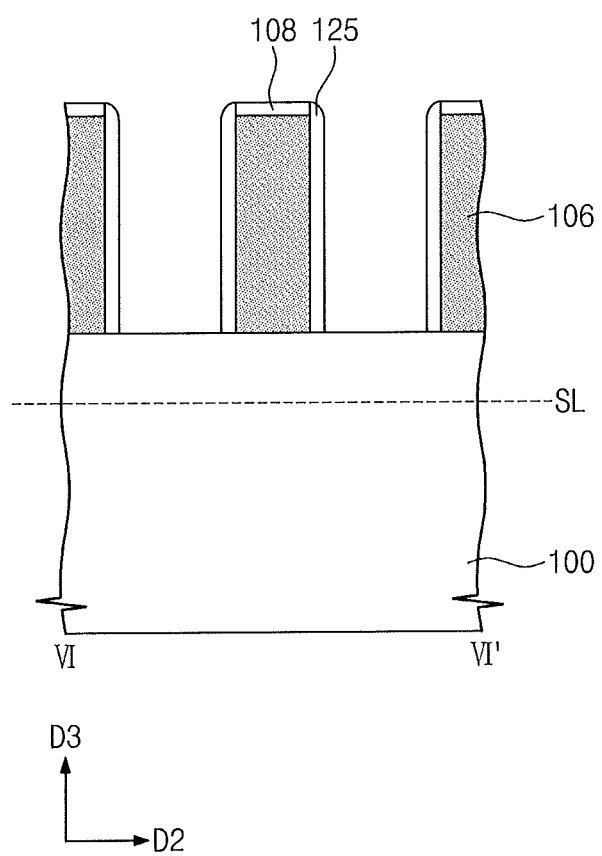
Figure 12A:
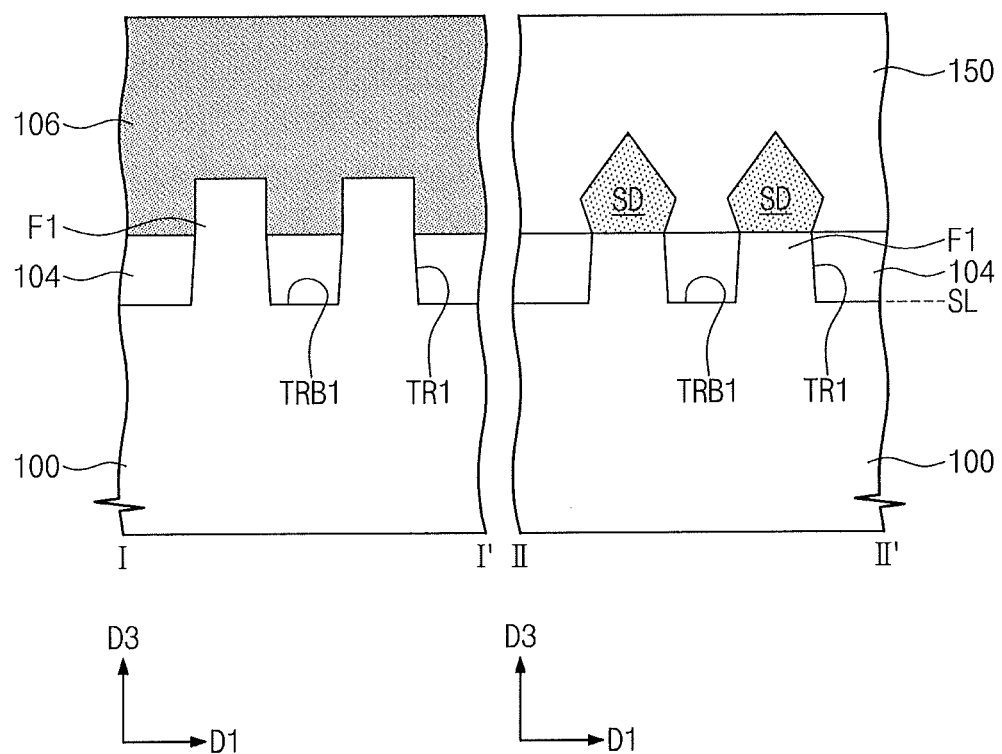
FIGS. 12A, 12B, 12C, and 12D are sectional views illustrating vertical sections taken along lines I-I', II-II', III-III', IV-IV', V-V', and VI-VI' of FIG. 10.
Figure 12B:
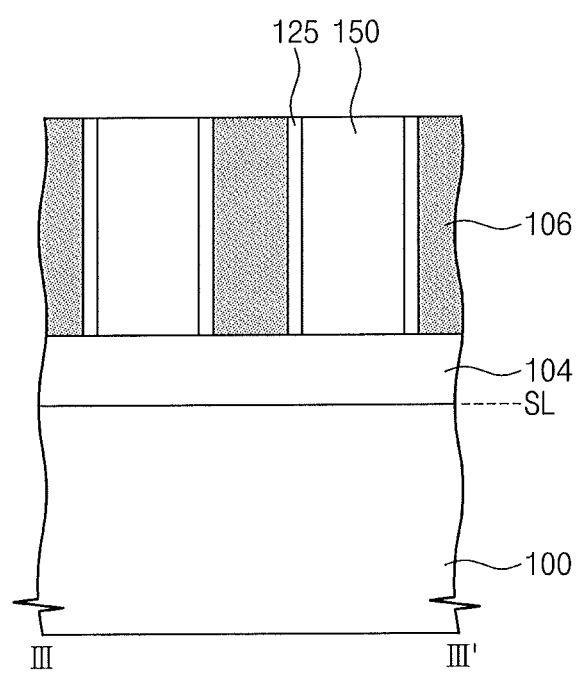
Figure 12C:
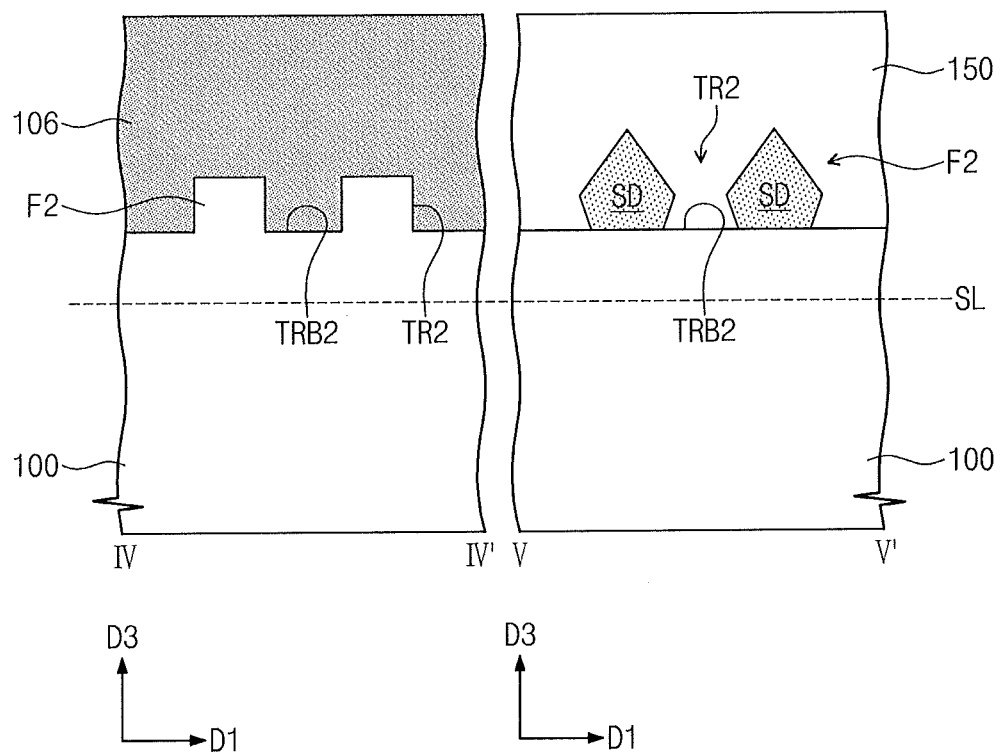
Figure 12D:
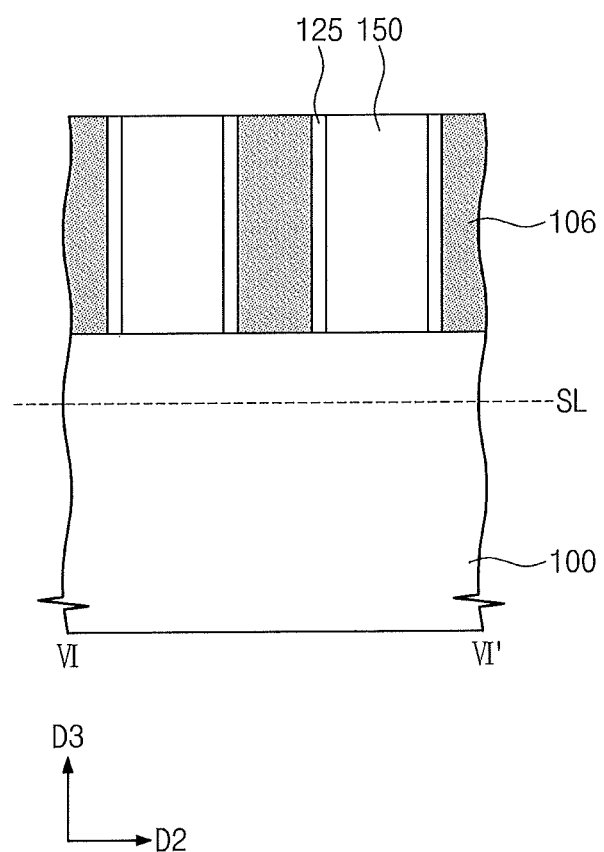
Figure 13:
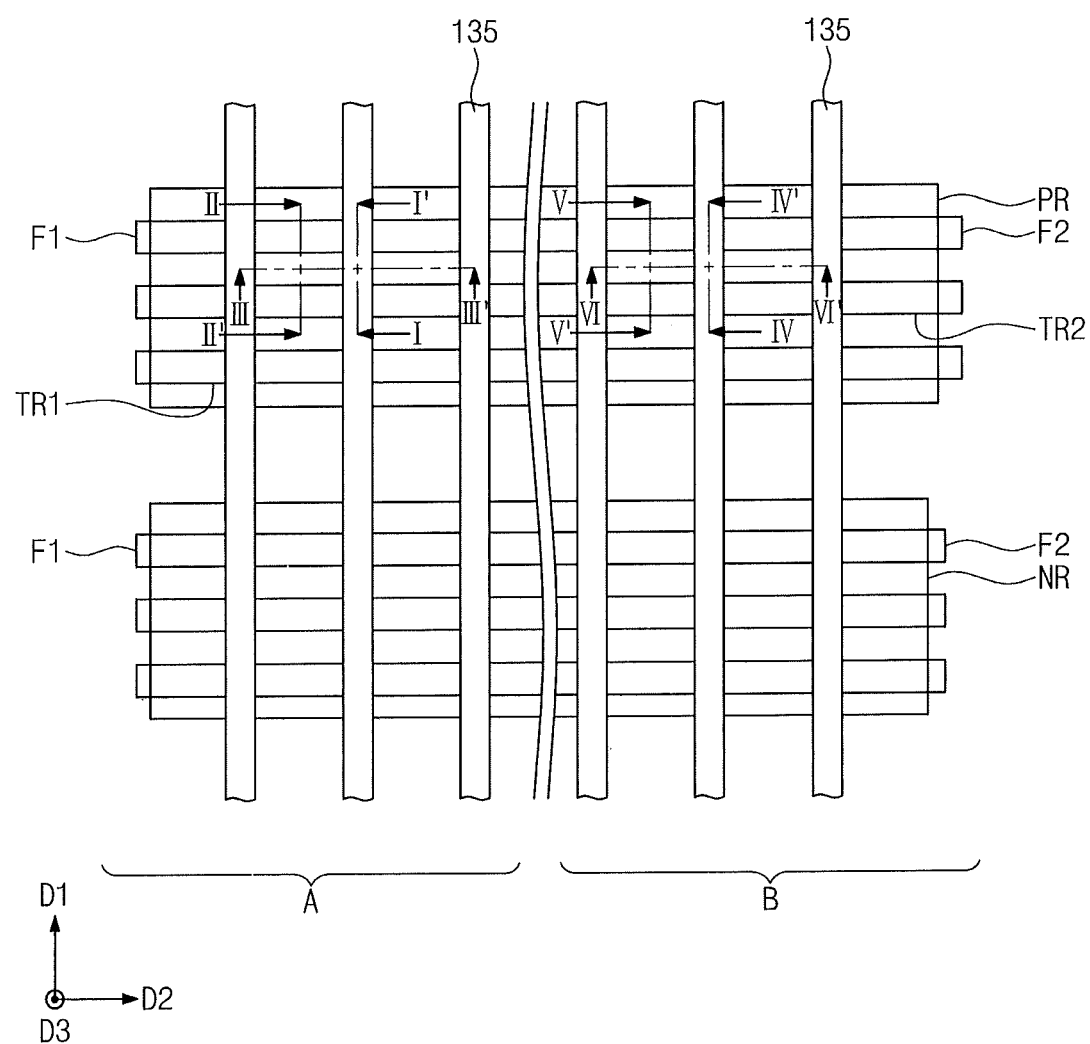
Figure 14A:
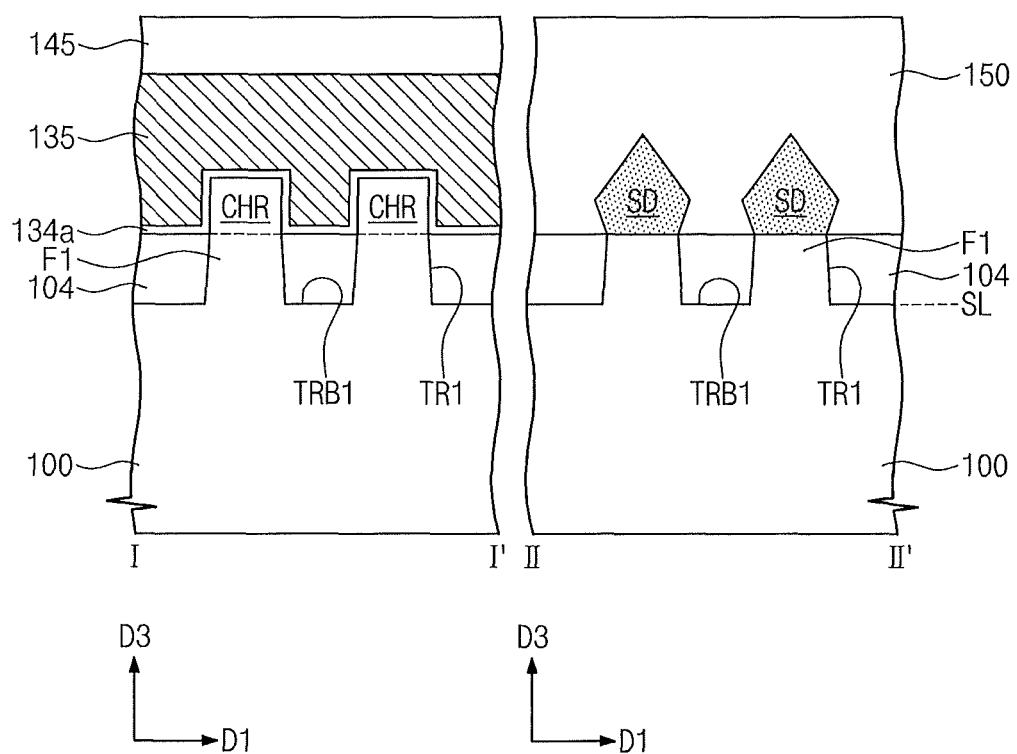
FIGS. 14A, 14B, 14C, and 14D are sectional views illustrating vertical sections taken along lines I-I', II-II', III-III', IV-IV', V-V', and VI-VI' of FIG. 13.
Figure 14B:
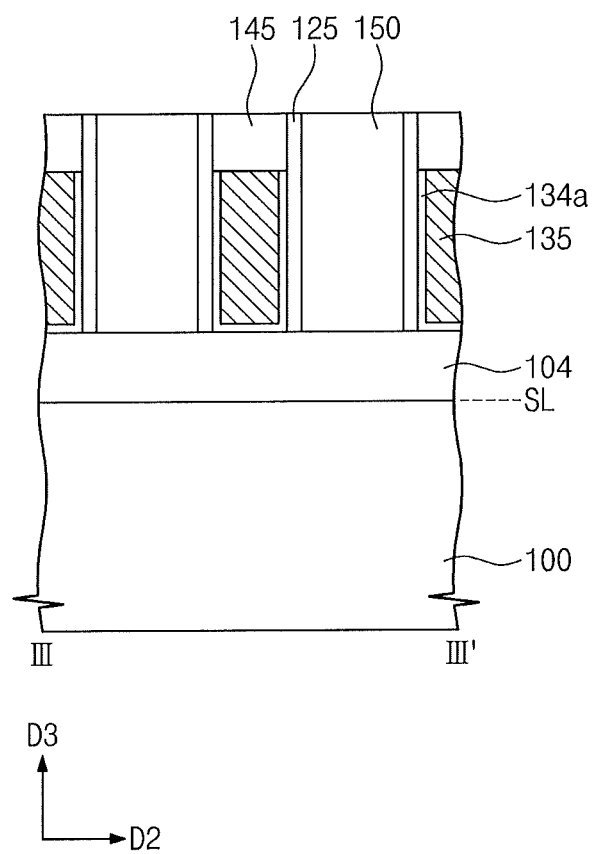
Figure 14C:
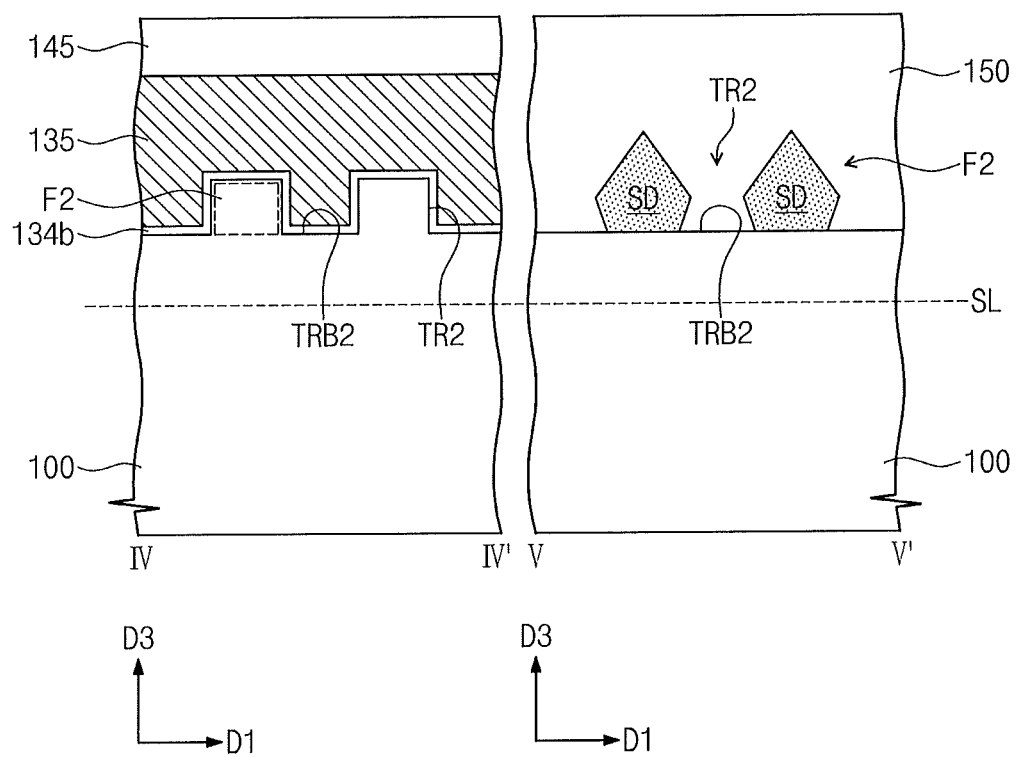
Figure 14D:
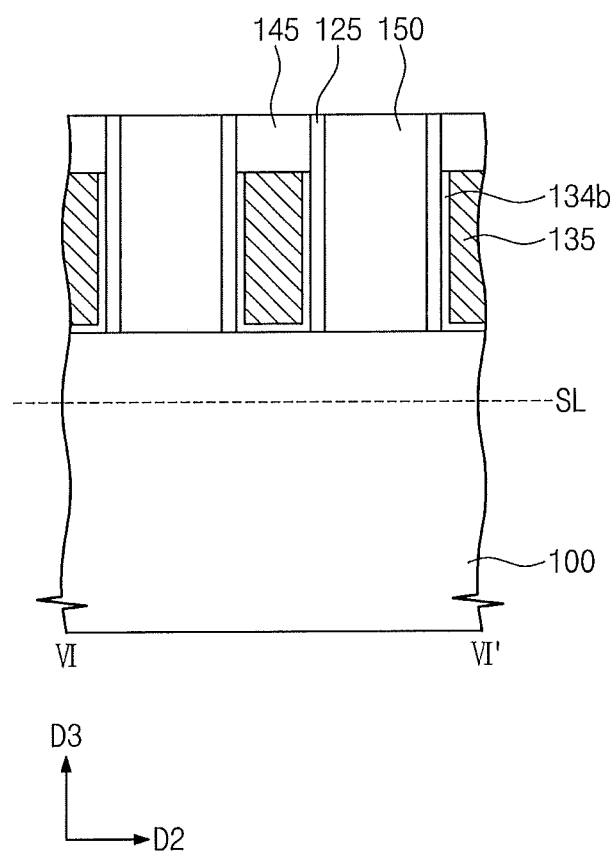

Referring to FIGS. 4, 5A, and 5B, a substrate 100 has a first region A and a second region B. The substrate 100 may be patterned to form a plurality of first active fins F1. First trenches TR1 may be formed between the first active fins F1. The first trenches TR1 may have bottom surfaces TRB1 positioned at a first level SLa. The substrate 100 may be a semiconductor substrate, e.g., of silicon, germanium, silicon-germanium, or the like, or a compound semiconductor substrate. The first active fins F1 may be doped to have a first conductivity type.

The formation of the first active fins F1 may include forming mask patterns on the substrate 100 and anisotropically etching the substrate 100 using the mask patterns as an etch mask. In some embodiments, each of the mask patterns may include a first mask pattern 110 and a second mask pattern 115, which are sequentially stacked and have an etch selectivity with respect to each other.

Although example embodiments of the inventive concept have been exemplified by the first region A, the process performed at the first region A may be performed at the second region B to form the second active fins F2 and the second trenches TR2 therebetween. The structures of the second active fins F2 and the second trenches TR2 may be similar to or the same as those of the first active fins F1 and the first trenches TR1 at the first region A. As an example, the bottom surfaces TRB2 of the second trenches TR2 may be positioned at the first level SLa.

Referring to FIGS. 6 and 7A through 7D, a first photoresist layer PL1 may be formed at the second region B to cover the second active fins F2. In some embodiments, the first photoresist layer PL1 is formed at only the second region B to expose the first region A.

Thereafter, an upper portion of the substrate 100 on the first region A may be etched using the first photoresist layer PL1 and the first and second mask patterns 110 and 115 as an etch mask. Accordingly, the first trenches TR1 may be further etched to have the bottom surfaces TRB1 positioned at the reference level SL, which may be lower than the first level SLa. As an example, each of the first trenches TR1 may be formed to have an aspect ratio of at least 5. Each of the first trenches TR1 may be formed to have a downward tapered shape. Accordingly, each of the first active fins F1 may be formed to have an upward tapered shape.

The first photoresist layer PL1 may protect the second trenches TR2 of the second region B during a process that may include etching the first trenches TR1. Accordingly, the bottom surfaces TRB2 of the second trenches TR2 may be still positioned at the first level SLa after another etching process.

Referring to FIGS. 8 and 9A through 9D, the device isolation layers 104 may be formed to fill the first trenches TR1. First, the first photoresist layer PL1 and the first and second mask patterns 110 and 115 may be removed. Next, an insulating layer, e.g., a silicon oxide layer, may be formed to fill the first and second trenches TR1 and TR2. Thereafter, the insulating layer may be recessed to expose the bottom surfaces TRB2 of the second trenches TR2. The recessing of the insulating layer may be performed using, for example, a wet etching process. The wet etching process may be performed using an etch recipe having an etch selectivity with respect to the first and second active fins F1 and F2.

Accordingly, the device isolation layers 104 may be locally formed in the first trenches TR1. The device isolation layers 104 may not be formed in the second trenches TR2. The top surfaces of the device isolation layers 104 may be positioned at substantially the same level as, or at a lower level than, the first level SLa.

Referring to FIGS. 10 and 11A through 11D, sacrificial gate patterns 106 and gate mask patterns 108 may be sequentially stacked on the first and second active fins F1 and F2, respectively. Each of the sacrificial gate patterns 106 and the gate mask patterns 108 may cross the first and second active fins F1 and F2, or otherwise have a line- or bar-shaped structure extending in the first direction D1. The formation of the sacrificial gate patterns 106 and the gate mask patterns 108 may include sequentially forming a sacrificial gate layer and a gate mask layer on the first and second regions A and B, respectively, and patterning them. The sacrificial gate layer may be formed of or include a poly-silicon layer. The gate mask layer may be formed of or include a silicon nitride layer or a silicon oxynitride layer.

Gate spacers 125 may be formed on both sidewalls of each of the sacrificial gate patterns 106. The formation of the gate spacers 125 may include conformally forming a spacer layer on the resulting structure provided with the sacrificial gate patterns 106 and anisotropically etching the spacer layer. The spacer layer may be formed of or include at least one of $SiO_2$, SiCN, SiCON, or SiN. Alternatively, the spacer layer may be a multi-layer structure including at least one of $SiO_2$, SiCN, SiCON, or SiN.

Referring to FIGS. 10 and 12A through 12D, source/drain patterns SD may be formed at both sides of each of the sacrificial gate patterns 106. For example, the source/drain patterns SD may be formed by a selective epitaxial growth process using the substrate 100 as a seed layer. The selective epitaxial growth process may include a chemical vapor deposition (CVD) process or a molecular beam epitaxy (MBE) process. In detail, the first and second active fins F1 and F2 may be selectively etched using the gate mask patterns 108 and the gate spacers 125 as an etch mask. Thereafter, the source/drain patterns SD may be grown using the exposed upper portions of the first and second active fins F1 and F2 as a seed layer. As a result of the formation of the source/drain patterns SD, one or more channel regions CHR may be defined between the source/drain patterns SD of the first active fins F1.

The top surfaces of the source/drain patterns SD may be higher than those of the channel regions CHR. In addition, the top surfaces of the source/drain patterns SD may have a non-zero curvature. For example, the top surfaces of the source/drain patterns SD may have an upwardly convex profile.

The source/drain patterns SD may have a second conductivity type that is different from the first conductivity type of the first and second active fins F1 and F2. As an example, the source/drain patterns SD of the second conductivity type may be formed by an in-situ doping process. As another example, the source/drain patterns SD of the second conductivity type may be formed by performing an ion implantation process on the source/drain patterns SD after forming the source/drain patterns SD.

Next, the first interlayered insulating layer 150 may cover the source/drain patterns SD. For example, the formation of the first interlayered insulating layer 150 may include forming an insulating layer on the substrate 100 to cover the sacrificial gate patterns 106 and the gate mask patterns 108. The first interlayered insulating layer 150 may include a silicon oxide layer, which may be formed by a flowable chemical vapor deposition (FCVD) process or the like.

The first interlayered insulating layer 150 may be planarized to expose the top surfaces of the sacrificial gate patterns 106. The planarization of the first interlayered insulating layer 150 may be performed using an etch-back process, a chemical-mechanical polishing (CMP) process or the like. The planarization of the first interlayered insulating layer 150 may be performed to remove the gate mask patterns 108, and thus, the top surfaces of the sacrificial gate patterns 106 may be exposed. Also, the planarization of the first interlayered insulating layer 150 may be performed to remove upper portions of the gate spacers 125. As a result, the first interlayered insulating layer 150 may have a top surface that is substantially coplanar with top layers of the sacrificial gate patterns 106 and the gate spacers 125, respectively.

Referring to FIGS. 13 and 14A through 14D, the sacrificial gate patterns 106 may be replaced with gate structures. Each of the gate structures may include the dielectric layer 134a and 134b, the gate electrode 135, and the gate capping layer 145.

The sacrificial gate patterns 106 may be removed to form gate trenches. The gate trenches may be formed by an etching process of selectively removing the sacrificial gate patterns 106. The gate trenches may be formed to partially expose the first and second active fins F1 and F2.

The first dielectric layer 134a and the gate electrode 135 may be formed in each of the gate trenches of the first region A. The first dielectric layer 134a may be formed to conformally cover or at least partially fill the gate trench. The first dielectric layer 134a may be formed by an atomic layer deposition (ALD) process, a chemical oxidation process, or the like. As an example, the first dielectric layer 134a may be formed of or include a high-k dielectric material. For example, the first dielectric layer 134a may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Thereafter, a gate electrode layer may be formed on the first dielectric layer 134a to fill the gate trenches, and the gate electrode layer and the first dielectric layer 134a may be planarized to expose the top surface of the first interlayered insulating layer 150. Accordingly, the first dielectric layer 134a and the gate electrode 135 may be locally formed in each of the gate trenches. As shown and described herein, the first dielectric layer 134a and the gate electrode 135 may extend in the first direction D1. In some embodiments, the gate electrode layer may be formed of or include at least one of conductive metal nitrides, e.g., titanium nitride or tantalum nitride or metals, e.g., titanium, tantalum, tungsten, copper, or aluminum. The gate electrode layer may be formed by a deposition process, e.g., a CVD or sputtering process, or the like. The planarization of the gate electrode layer and the first dielectric layer 134a may include a CMP process or the like.

Thereafter, upper portions of the gate electrodes 135 may be recessed, and the gate capping layers 145 may be formed on the gate electrodes 135, respectively. In detail, a selective etching process may be performed to remove the upper portions of the gate electrodes 135. As a result of the etching process, the top surfaces of the gate electrodes 135 may be lower than the top surface of the first interlayered insulating layer 150. In some embodiments, portions of the first dielectric layer 134a positioned above the gate electrodes 135 may be removed after the recessing of the upper portions of the gate electrodes 135. As a result, the first dielectric layer 134a may be provided between the gate electrode 135 and the first active fin F1 and between the gate electrode 135 and the gate spacers 125.

The gate capping layers 145 may cover the recessed top surfaces of the gate electrodes 135, respectively. The gate capping layers 145 may be formed to fill the empty regions, which are formed by recessing the upper portions of the gate electrodes 135. The gate capping layers 145 may be formed of a material having an etch selectivity with respect to the first and second interlayered insulating layers 150 and 155. For example, the gate capping layers 145 may include at least one of SiON, SiCN, SiCON, or SiN. The gate capping layers 145 may be formed by an atomic layer deposition (ALD) process, a plasma-enhanced chemical vapor deposition (PECVD) process, a high-density plasma chemical vapor deposition (HDPCVD) process, or related process.

The second dielectric layer 134b, the gate electrode 135, and the gate capping layer 145 may be formed in each of the gate trenches of the second region B, and may be formed by performing a process that includes forming the first dielectric layer 134a, the gate electrode 135, and the gate capping layer 145 on the first region A.

Referring back to FIGS. 2 and 3A through 3D, the second interlayered insulating layer 155 may be formed on the first interlayered insulating layer 150 and the gate capping layer 145. The second interlayered insulating layer 155 may be formed of or include a silicon oxide layer or a low-k oxide layer. The low-k oxide layer may include, for example, a carbon-doped silicon oxide layer (e.g., SiCOH). The second interlayered insulating layer 155 may be formed by a CVD process.

Next, contact holes 160 may be formed to penetrate the second interlayered insulating layer 155 and the first interlayered insulating layer 150 and to expose the source/drain patterns SD. The contact holes 160 may be formed at the first region A. As an example, the contact holes 160 may be formed in a self-aligned manner by the gate capping layers 145 and the gate spacers 125. For example, the formation of the contact holes 160 may include forming a photoresist pattern (not shown) on the second interlayered insulating layer 155 to define positions and dispositions of the contact holes 160 and performing an anisotropic etching process or the like using the photoresist pattern as an etch mask. The photoresist pattern (not shown) may be formed to have openings (not shown), whose planar shapes are substantially equal or similar to those of the contact holes 160.

The contacts CA may be formed in the contact holes 160 to provide electrical contact with the source/drain patterns SD. Each of the contacts CA may include a conductive pillar CP and a barrier layer BL that encloses the conductive pillar CP. For example, the barrier layer BL may at least partially fill the contact holes 160. Next, a conductive layer may completely fill the contact holes 160 provided with the barrier layer BL and may be planarized to expose the top surface of the second interlayered insulating layer 155. The barrier layer BL may be formed of or include at least one of metals or metal nitrides, e.g., Ti/TiN, and the conductive layer may be formed of or include at least one of metallic materials, e.g., tungsten.

In some embodiments, the etching process may be performed using the first photoresist layer PL1 that locally exposes elements of the first region A, and the first photoresist layer PL1 may make it possible to realize a difference in depth between the first and second trenches TR1 and TR2. Accordingly, unlike the first dielectric layer 134*a* on the first region A, the second dielectric layer 134*b* on the second region B may be formed to cover not only the second active fins F2 but also the bottom surfaces TRB2 of the second trenches TR2. Accordingly, the capacitors may have an increased electric capacitance.

Figure 15A:
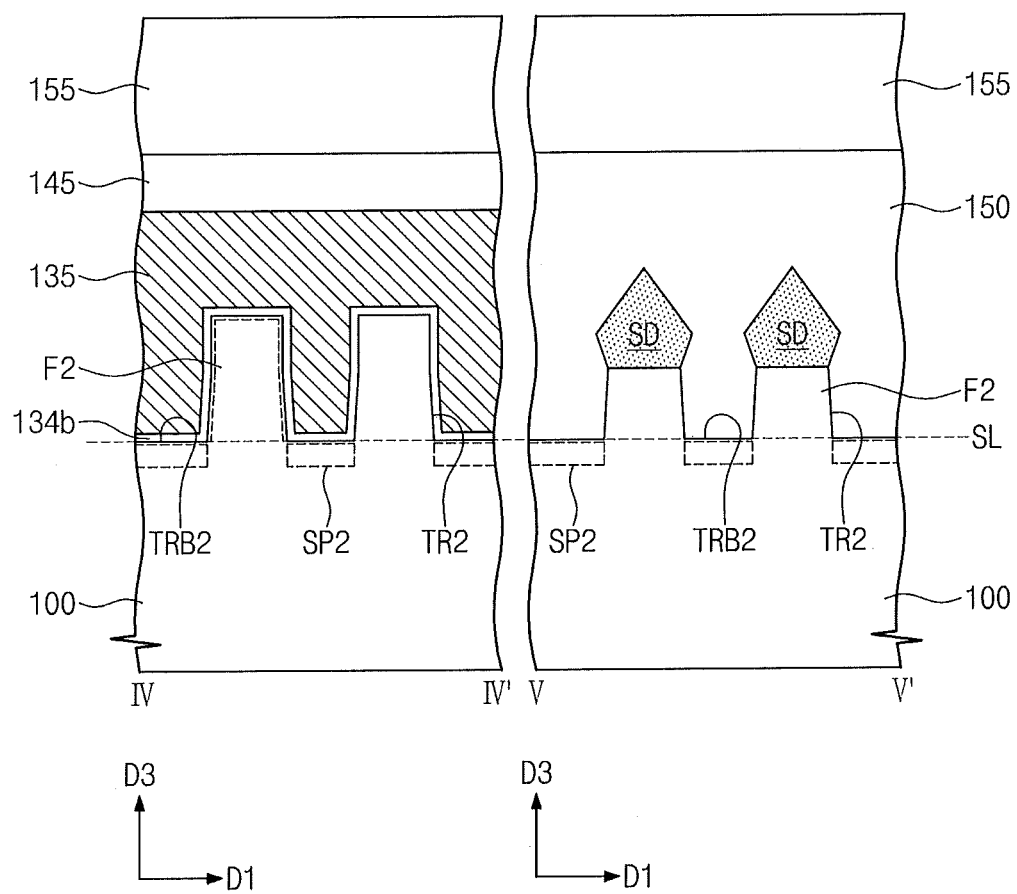
FIGS. 15A and 15B are sectional views illustrating a semiconductor device according to example embodiments of the inventive concept.
Figure 15B:
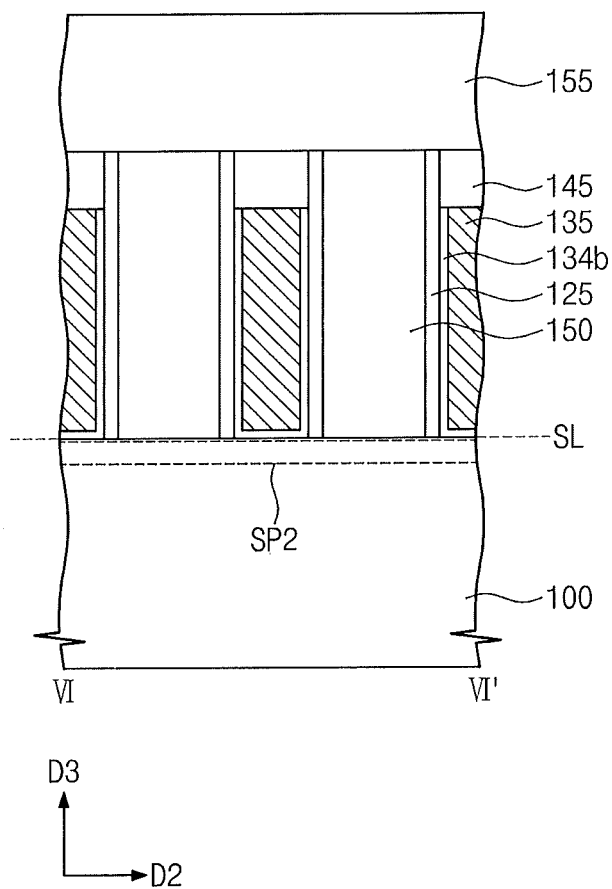

FIGS. 15A and 15B are sectional views illustrating a semiconductor device according to example embodiments of the inventive concept. FIG. 15A is a sectional view illustrating vertical sections taken along lines IV-IV' and V-V' of FIG. 2, and FIG. 15B is a sectional view taken along line VI-VI' of FIG. 2. In the following description, an element previously described with reference to FIGS. 2 and 3A through 3D may be identified by a similar or identical reference number without repeating an overlapping description thereof, for the sake of brevity.

Referring to FIGS. 2, 3A, 3B, 15A, and 15B, first active fins F1 and first trenches TR1 may be at the first region A. Second active fins F2 and second trenches TR2 may be provided at the second region B. The first active fins F1 and the first trenches TR1 may have substantially the same features as described with reference to FIGS. 2, 3A, and 3B.

The bottom surfaces TRB2 of the second trenches TR2 of the second region B may be positioned at a reference level SL. In other words, the bottom surfaces TRB2 of the second trenches TR2 may be positioned at substantially the same level as the bottom surfaces TRB1 of the first trenches TR1. In other words, the second active fins F2 may be substantially the same as the first active fins F1 in terms of structure and height. However, unlike the first region A, the device isolation layers 104 may not be formed in the second trenches TR2.

The second dielectric layer 134*b* may cover top and side surfaces of the second active fins F2. In addition, the second dielectric layer 134*b* may be horizontally extended to at least partially cover the top surfaces of the second shoulder portions SP2. When compared with the fin capacitors previously described with reference to FIGS. 3C and 3D, the second dielectric layer 134*b* may have an increased area due to the second trenches TR2 being formed to have a depth greater than those of FIGS. 3C and 3D.

Figure 16:
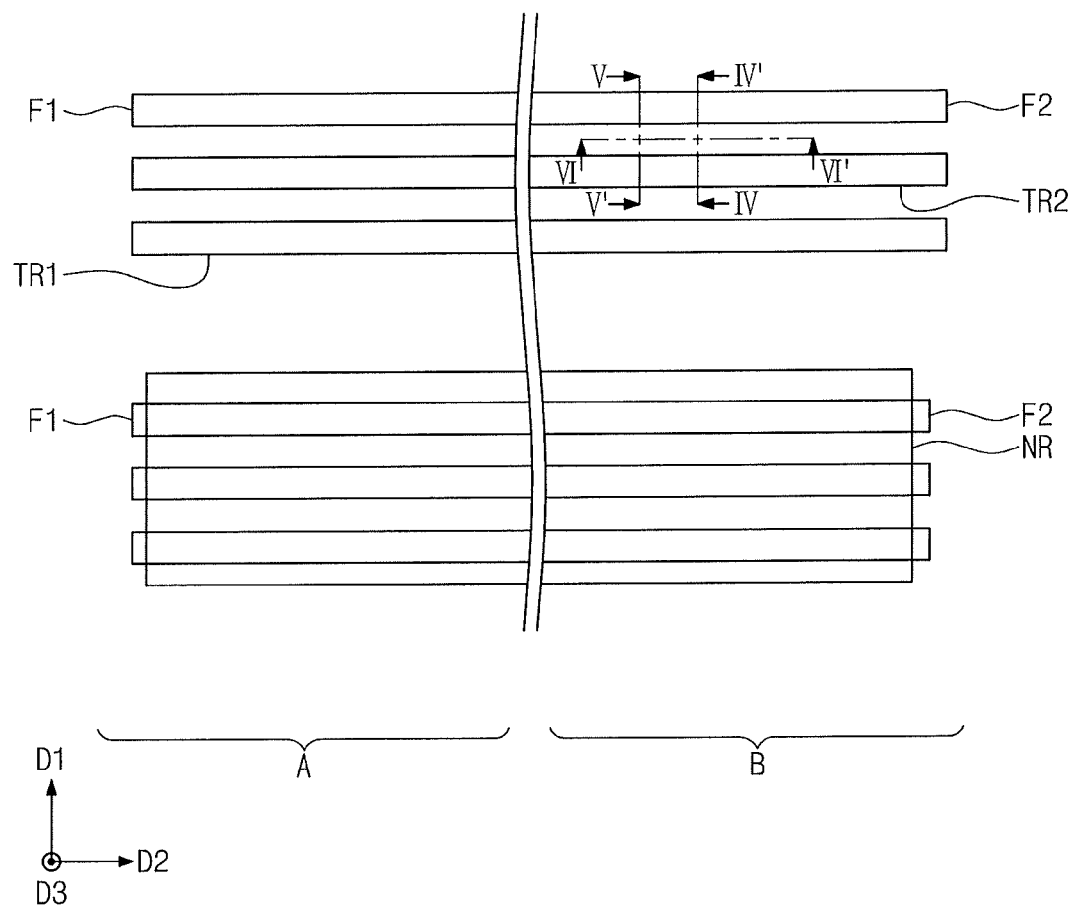
FIGS. 16 and 18 are plan views illustrating a method of fabricating a semiconductor device according to example embodiments of the inventive concept.
Figure 17A:
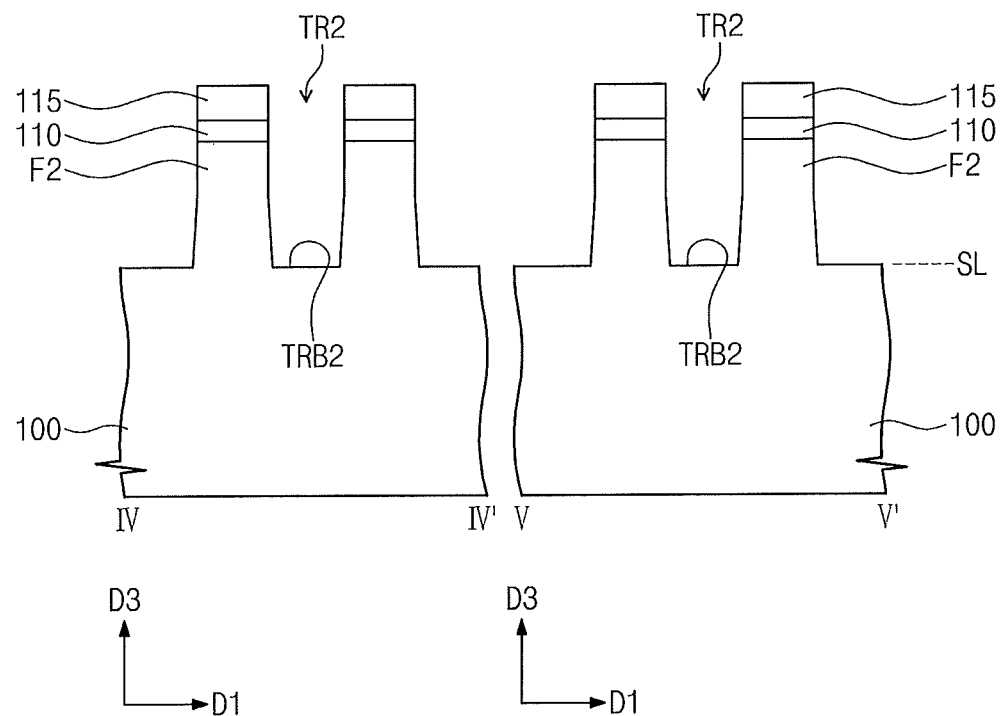
FIGS. 17A and 17B are sectional views illustrating vertical sections taken along lines IV-IV', V-V', and VI-VI' of FIG. 16.
Figure 17B:
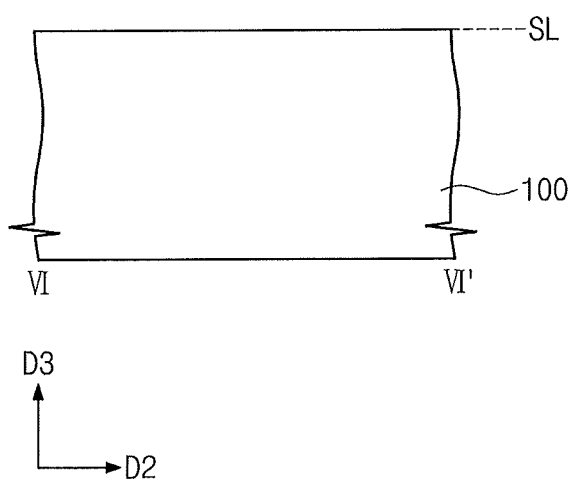
Figure 18:
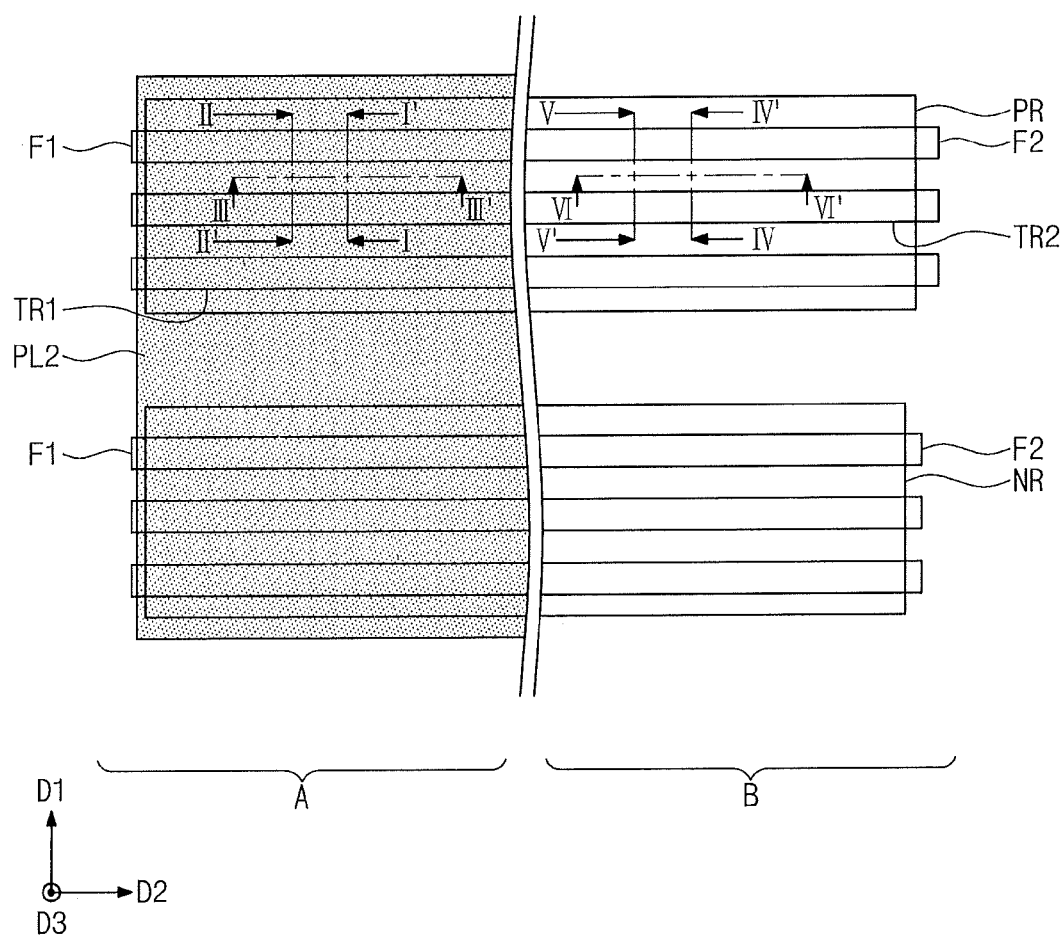
Figure 19A:
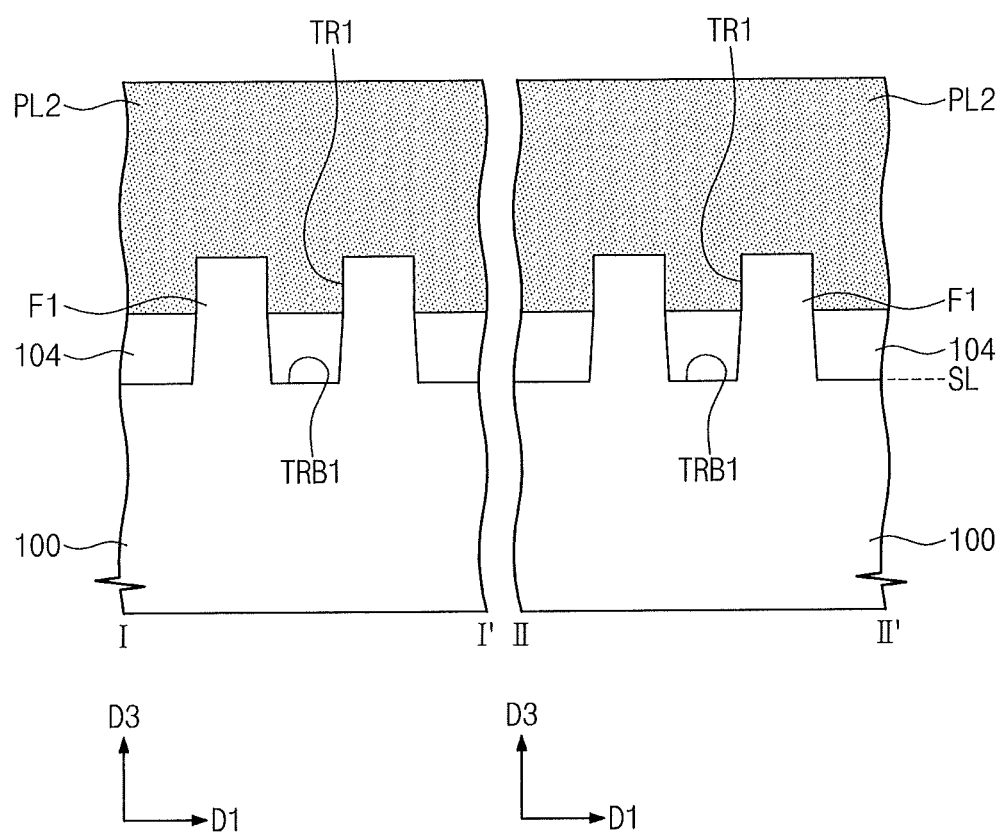
FIGS. 19A, 19B, 19C, and 19D are sectional views illustrating vertical sections taken along lines II-II', III-III', IV-IV', V-V', and VI-VI' of FIG. 18.
Figure 19B:
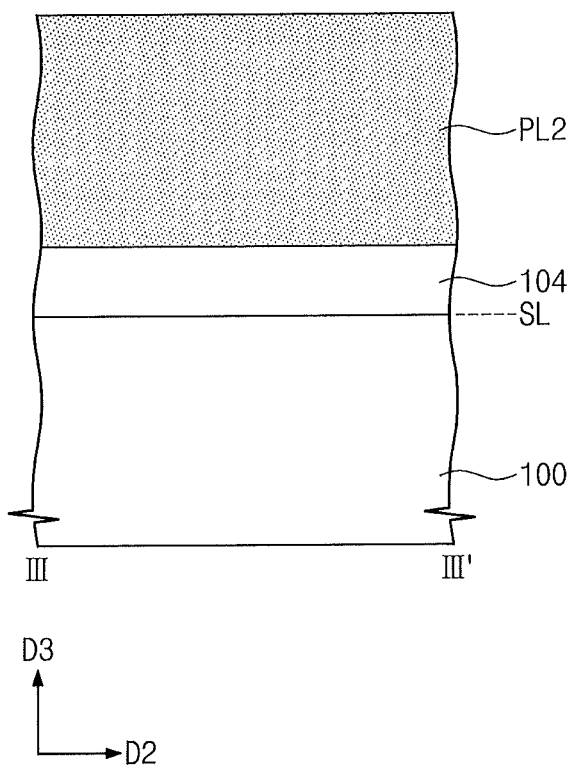
Figure 19C:
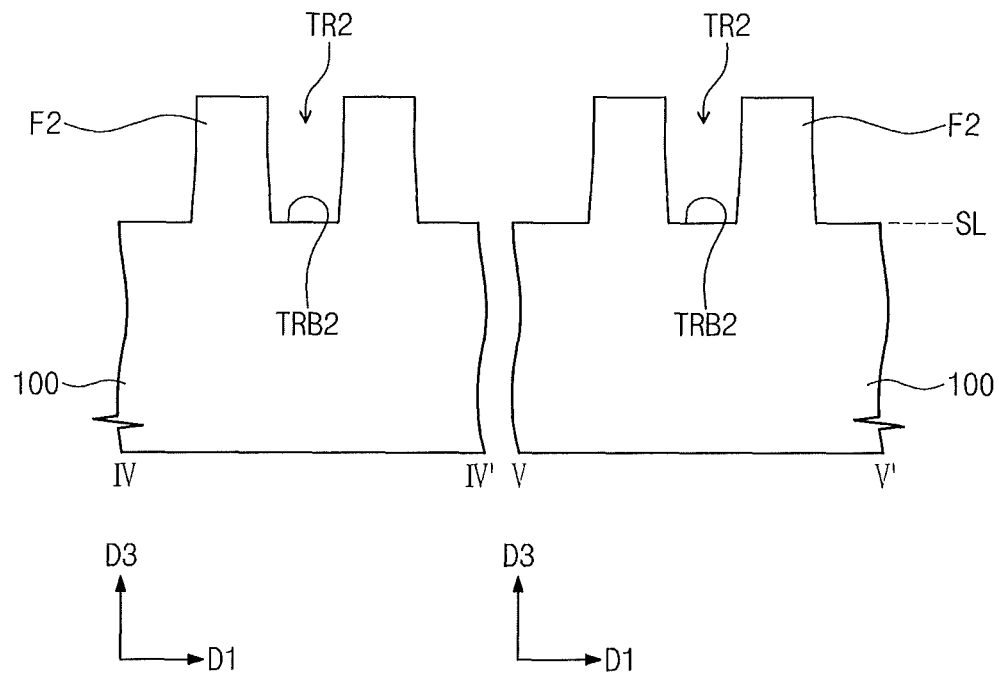
Figure 19D:
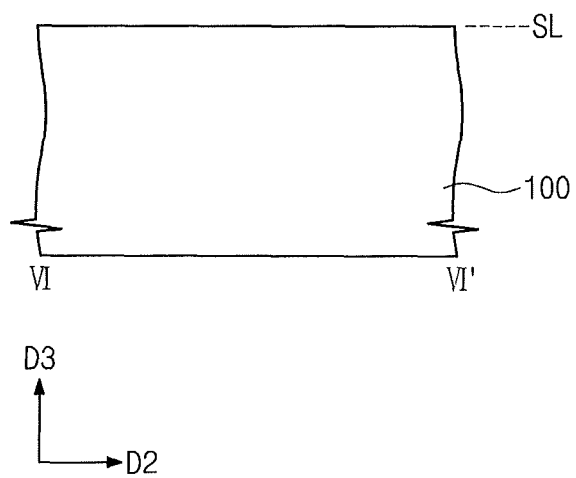

FIGS. 16 and 18 are plan views illustrating a method of fabricating a semiconductor device according to example embodiments of the inventive concept. FIGS. 17A and 17B are sectional views illustrating vertical sections taken along lines IV-IV', V-V', and VI-VI' of FIG. 16, and FIGS. 19A, 19B, 19C, and 19D are sectional views illustrating vertical sections taken along lines I-I', II-II', III-III', IV-IV', V-V', and VI-VI' of FIG. 18. In the following description, an element or step previously described with reference to FIGS. 4 through 14 may be identified by a similar or identical reference number without repeating an overlapping description thereof, for the sake of brevity.

Referring to FIGS. 16, 17A, and 17B, an anisotropic etching process may be performed on a resulting structure of FIGS. 4, 5A, and 5B to form first and second active fins F1 and F2 on first and second regions A and B, respectively, and the first and second trenches TR1 and TR2 therebetween. Although only the second region B is shown in FIGS. 17A and 17B, the first region A may have substantially the same features as those shown in FIGS. 7A and 7B.

Unlike the previous embodiments with reference to FIG. 6 and FIGS. 7A through 7D, the anisotropic etching process may be performed without the first photoresist layer PL1 (i.e., on both of the first and second regions A and B), all of the bottom surfaces TRB1 and TRB2 of the first and second trenches TR1 and TR2 may be positioned at or near the reference level SL.

Referring to FIGS. 18 and 19A through 19D, the first and second mask patterns 110 and 115 may be removed, and an insulating layer may be formed to fill the first and second trenches TR1 and TR2. Thereafter, a wet etching process or the like may be performed to recess the insulating layer and to form the device isolation layers 104 that fill the first and second trenches TR1 and TR2, respectively.

A second photoresist layer PL2 may be formed at the first region A to cover the first active fins F1 and the device isolation layers 104. The second photoresist layer PL2 may expose the second region B. Thereafter, the device isolation layers 104 in the second trenches TR2 may be completely removed using the second photoresist layer PL2 as an etch mask. The device isolation layers 104 in the first trenches TR1 may be protected by the second photoresist layer PL2. Accordingly, the device isolation layers 104 may remain in the first trenches TR1.

Thereafter, the process described with reference to FIGS. 8 through 14D may be performed to form gate structures on the first and second active fins F1 and F2.

Figure 20A:
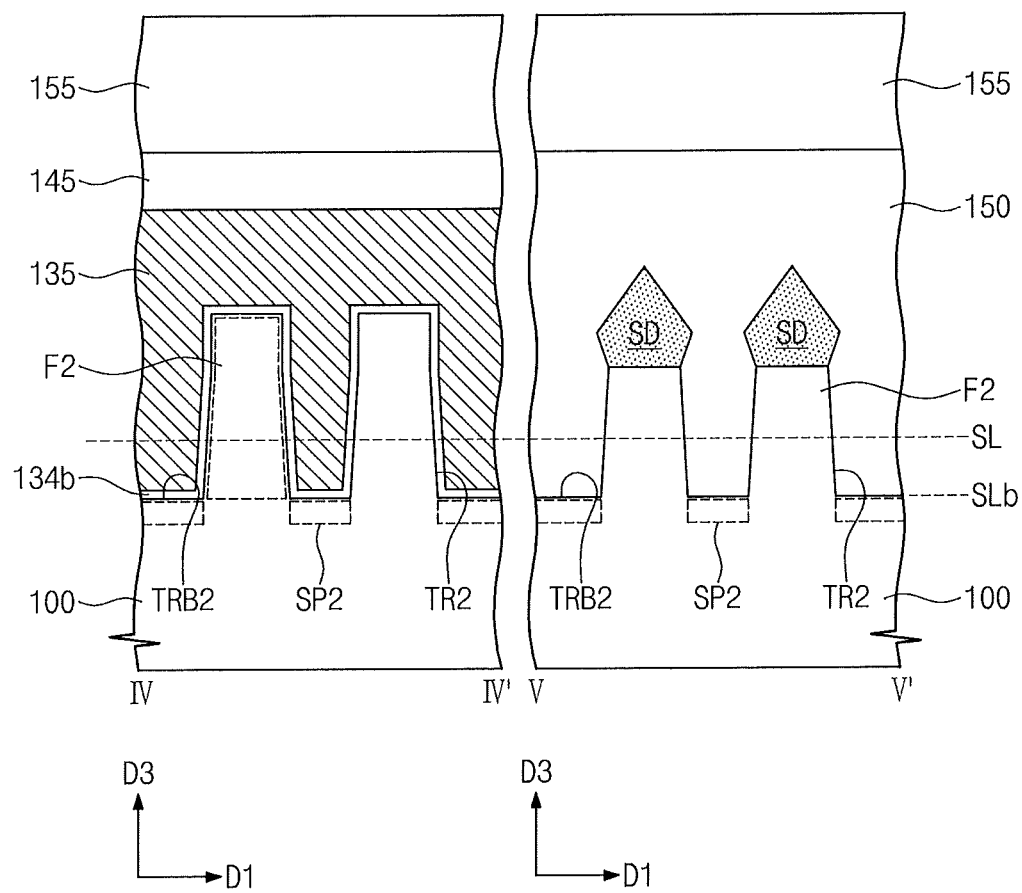
FIGS. 20A and 20B are sectional views illustrating a semiconductor device according to example embodiments of the inventive concept.
Figure 20B:
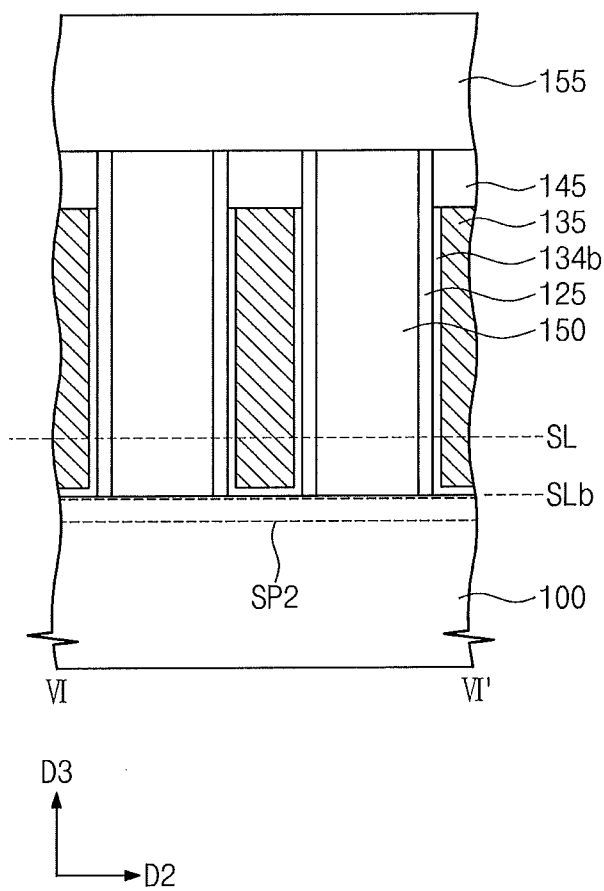

FIGS. 20A and 20B are sectional views illustrating a semiconductor device according to example embodiments of the inventive concept. FIG. 20A is a sectional view illustrating vertical sections taken along lines IV-IV' and V-V' of FIG. 2, and FIG. 20B is a sectional view taken along line VI-VI' of FIG. 2. In the following description, an element previously described with reference to FIGS. 2 and 3A through 3D may be identified by a similar or identical reference number without repeating an overlapping description thereof, for the sake of brevity.

Referring to FIGS. 2, 3A, 3B, 20A, and 20B, first active fins F1 and first trenches TR1 therebetween may be formed on the first region A, and the second active fins F2 and the second trenches TR2 therebetween may be formed on the second region B. The first active fins F1 and the first trenches TR1 may have substantially the same features as described with reference to FIGS. 2, 3A, and 3B.

The bottom surfaces TRB2 of the second trenches TR2 of the second region B may be positioned at a second level SLb. The second level SLb may be lower than the reference level SL. In other words, the bottom surfaces TRB2 of the second trenches TR2 may be positioned at a lower level than the bottom surfaces TRB1 of the first trenches TR1. In other words, the second trenches TR2 may be deeper than the first trenches TR1. Unlike the first region A, the device isolation layers 104 may not be formed in the second trenches TR2.

The second dielectric layer 134*b* may cover top and side surfaces of the second active fins F2. In addition, the second dielectric layer 134b may be horizontally extended to partially cover the top surfaces of the second shoulder portions SP2. When compared with the fin capacitors previously described with reference to FIGS. 3C and 3D, the second dielectric layer 134b may have an increased area. This is because the second trenches TR2 are formed to have a depth greater than counterpart trenches FIGS. 3C and 3D.

Figure 21:
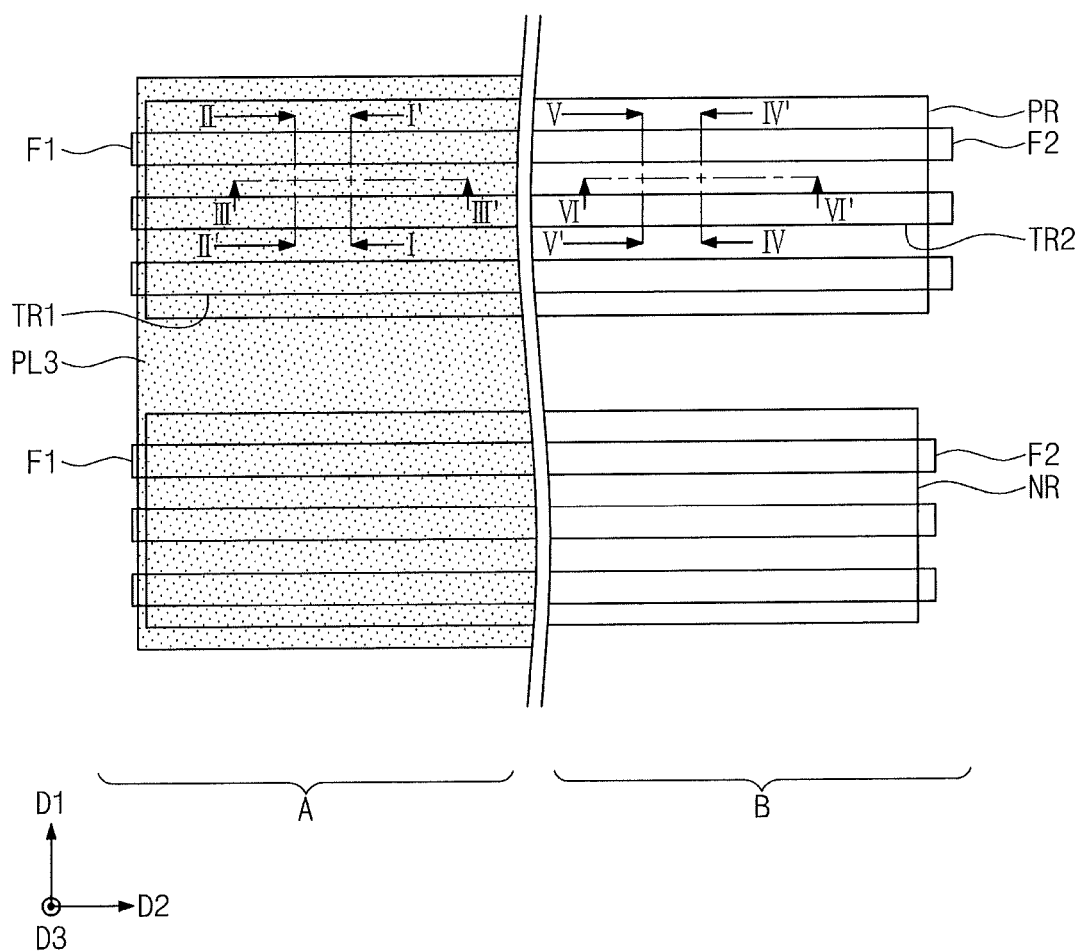
FIGS. 21, 23, and FIG. 25 are plan views illustrating a method of fabricating a semiconductor device according to example embodiments of the inventive concept.
Figure 22A:
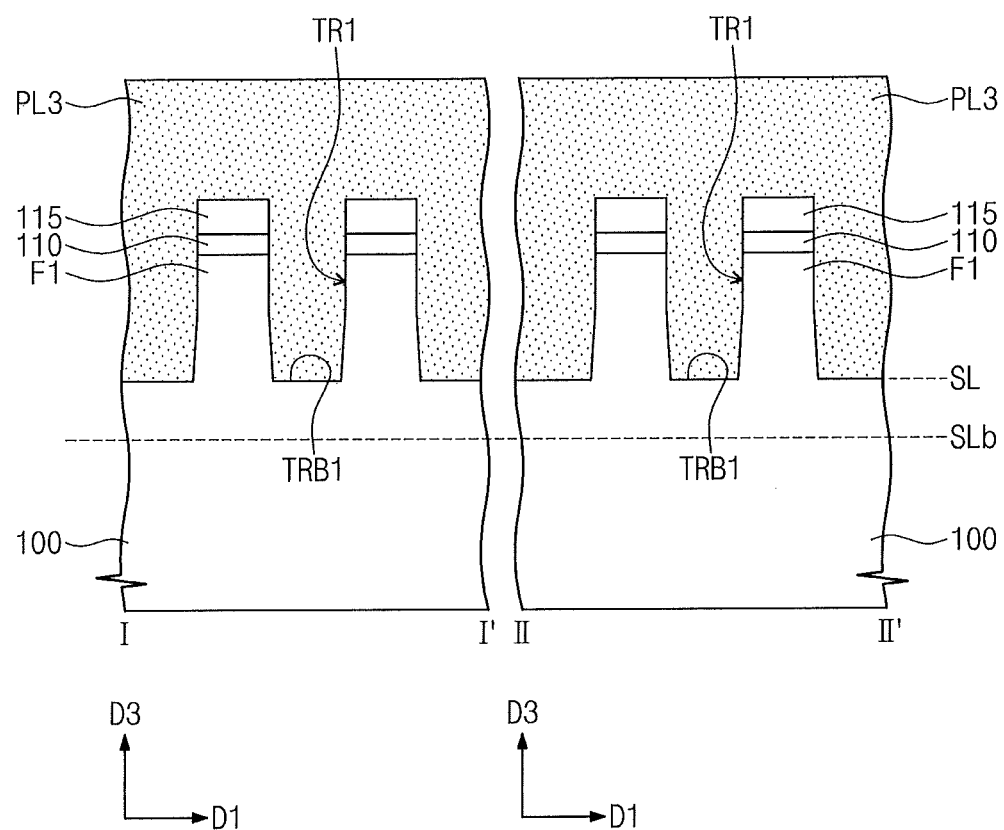
FIGS. 22A, 22B, 22C, and 22D are sectional views illustrating vertical sections taken along lines I-I', II-II', III-III', IV-IV', V-V', and VI-VI' of FIG. 21.
Figure 22B:
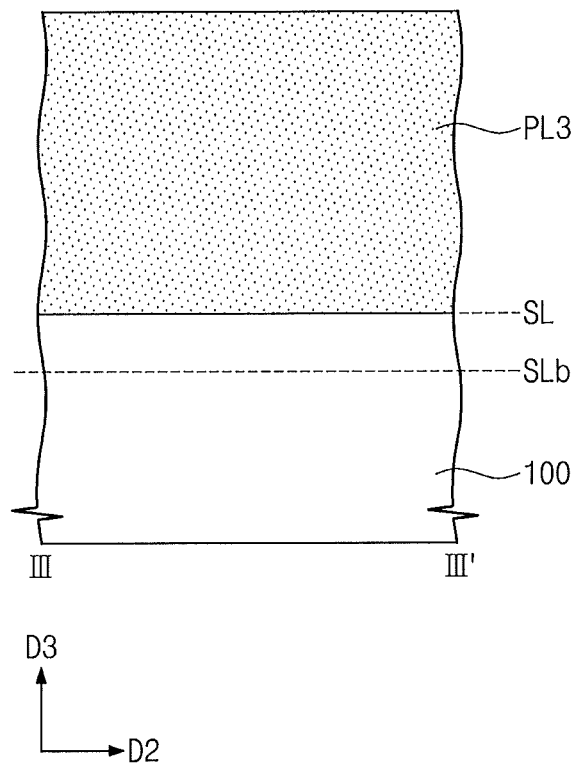
Figure 22C:
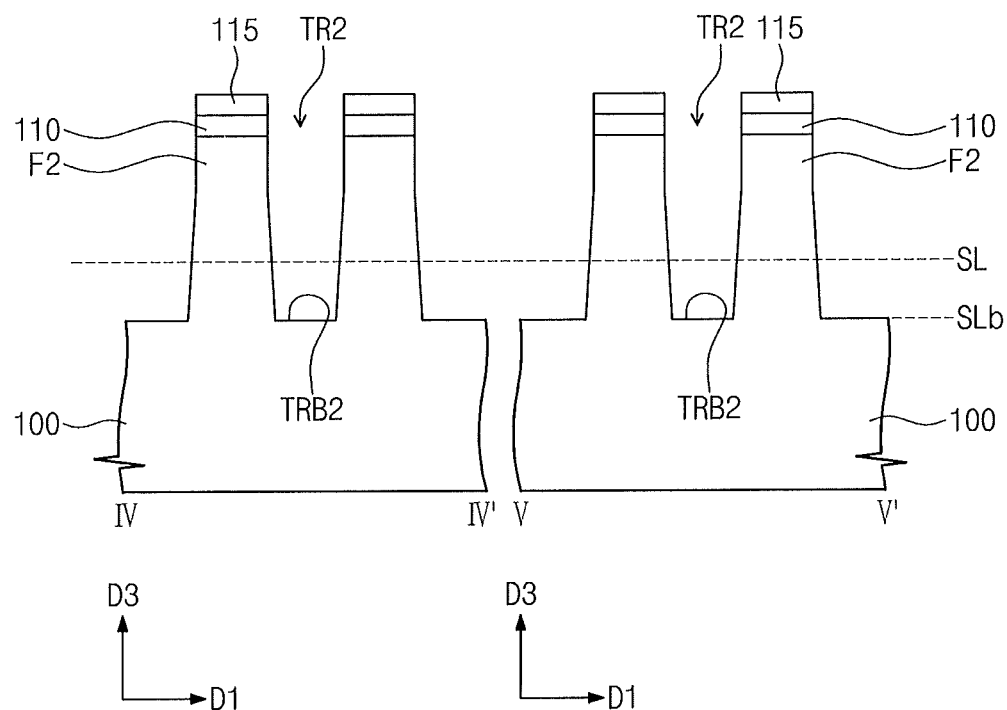
Figure 22D:
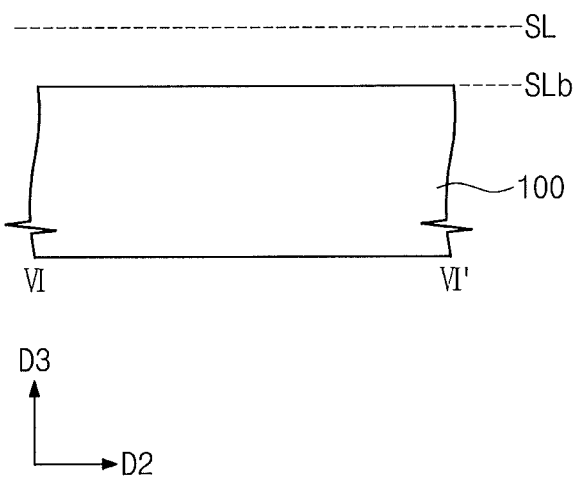
Figure 23:
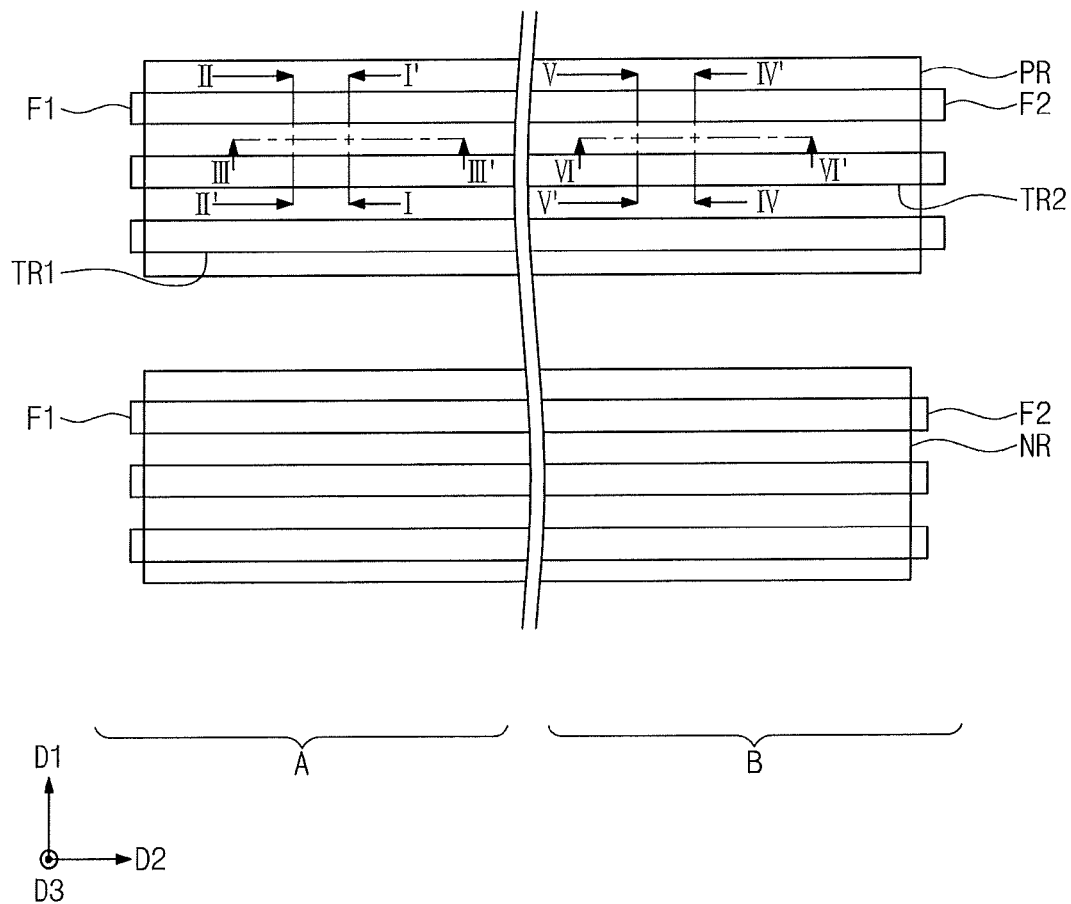
Figure 24A:
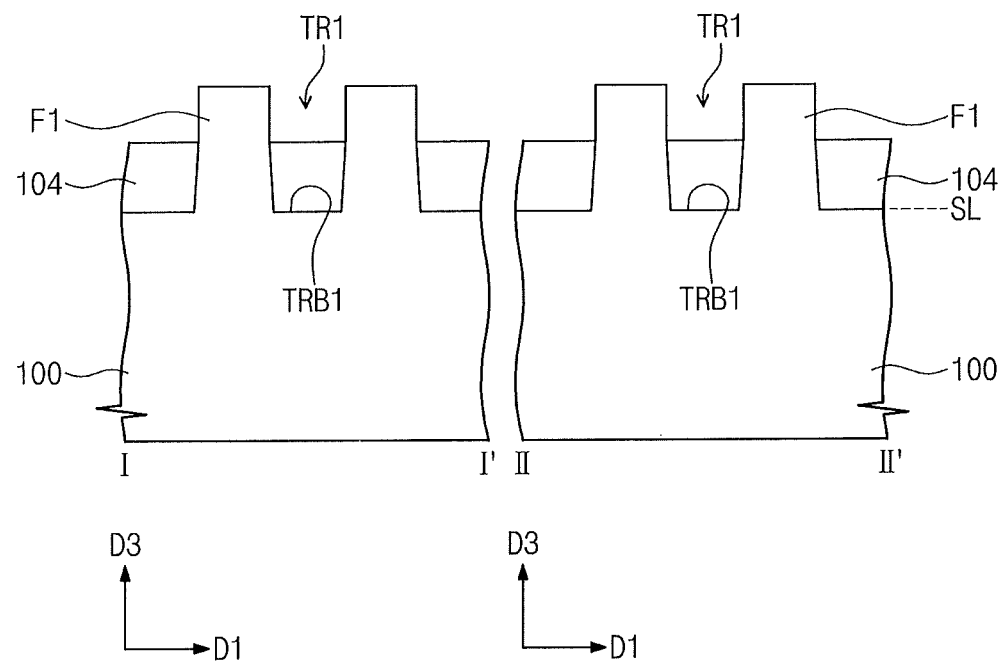
FIGS. 24A, 24B, 24C, and 24D are sectional views illustrating vertical sections taken along lines I-I', II-II', III-III', IV-IV', V-V', and VI-VI' of FIG. 23.
Figure 24B:
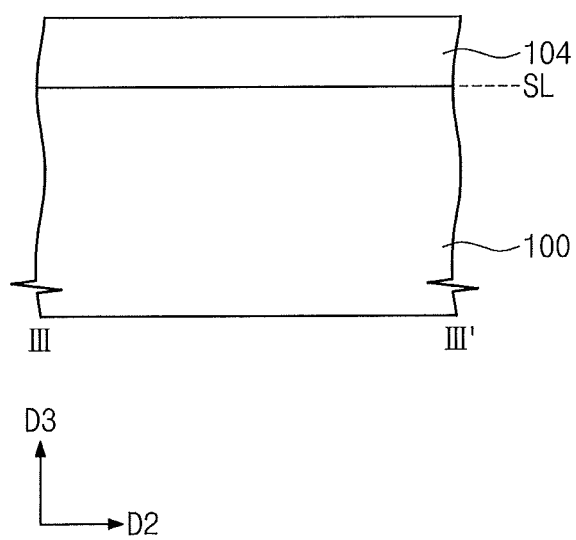
Figure 24C:
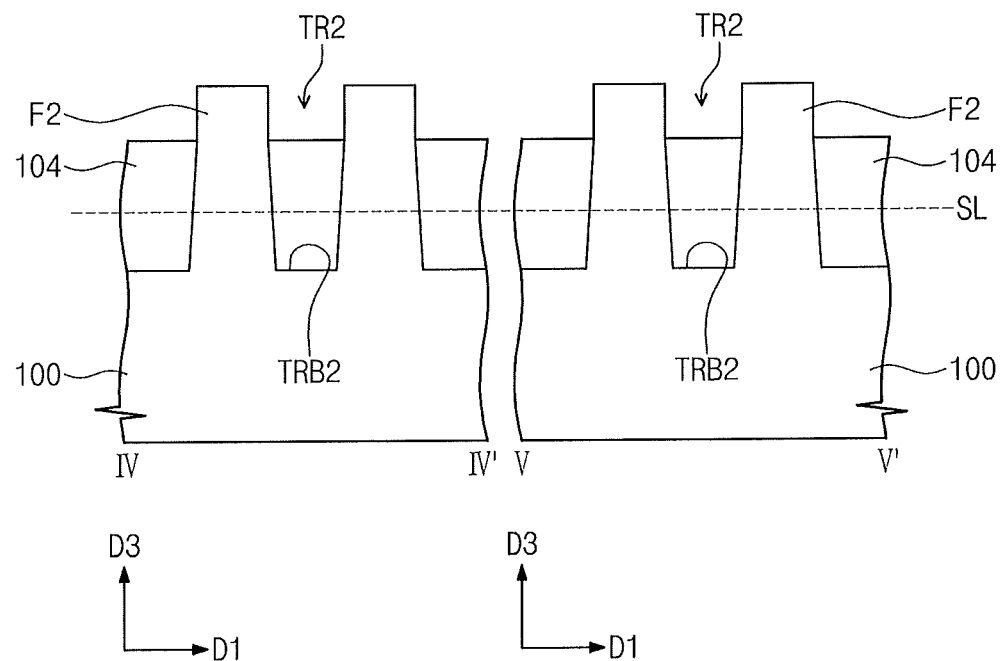
Figure 24D:
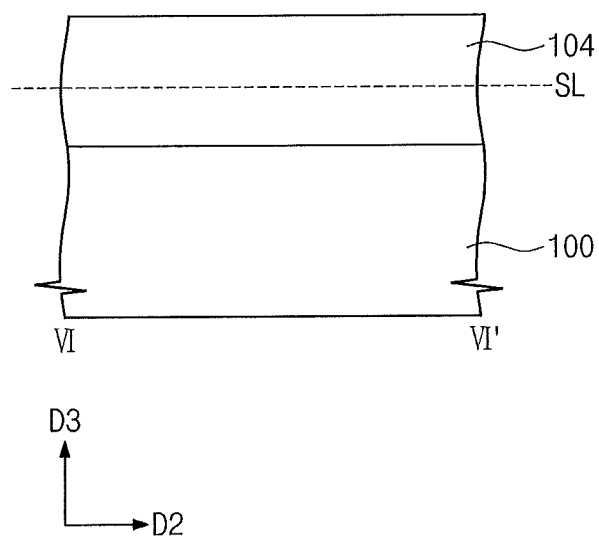
Figure 25:
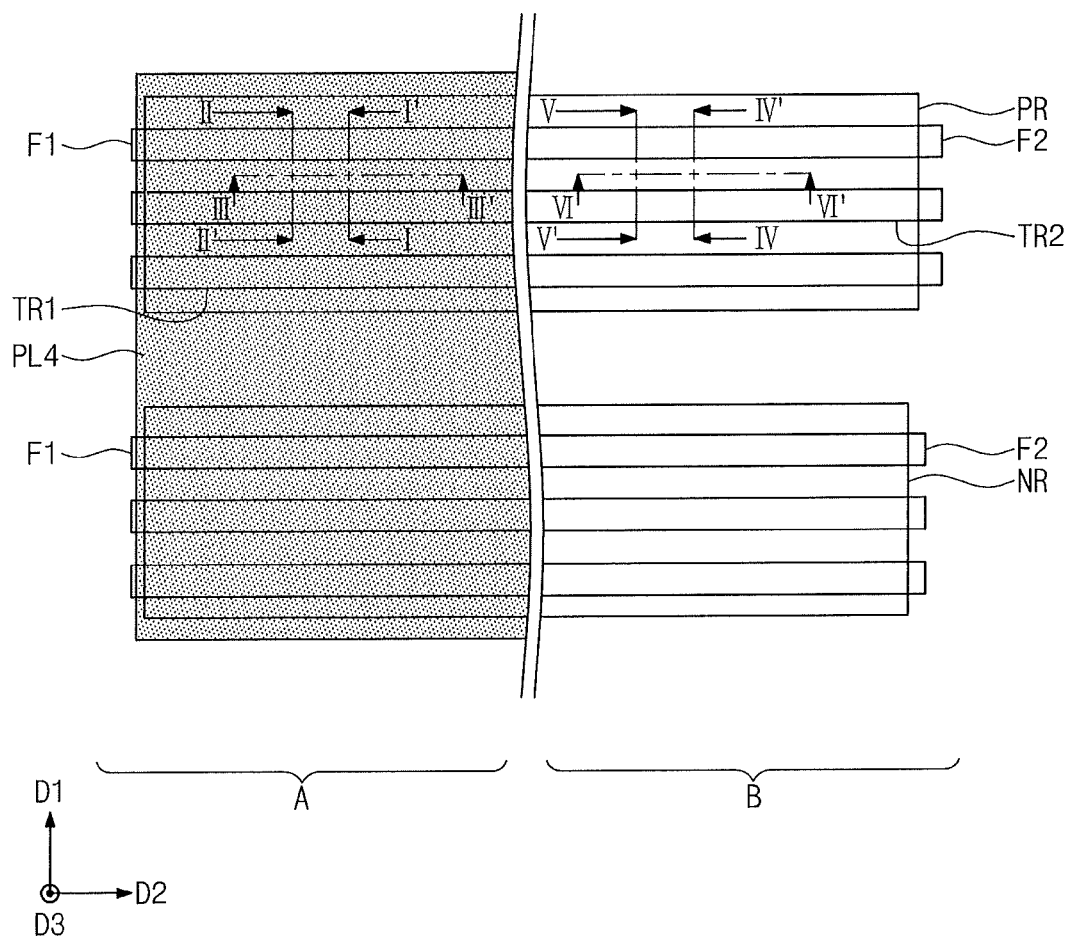
Figure 26A:
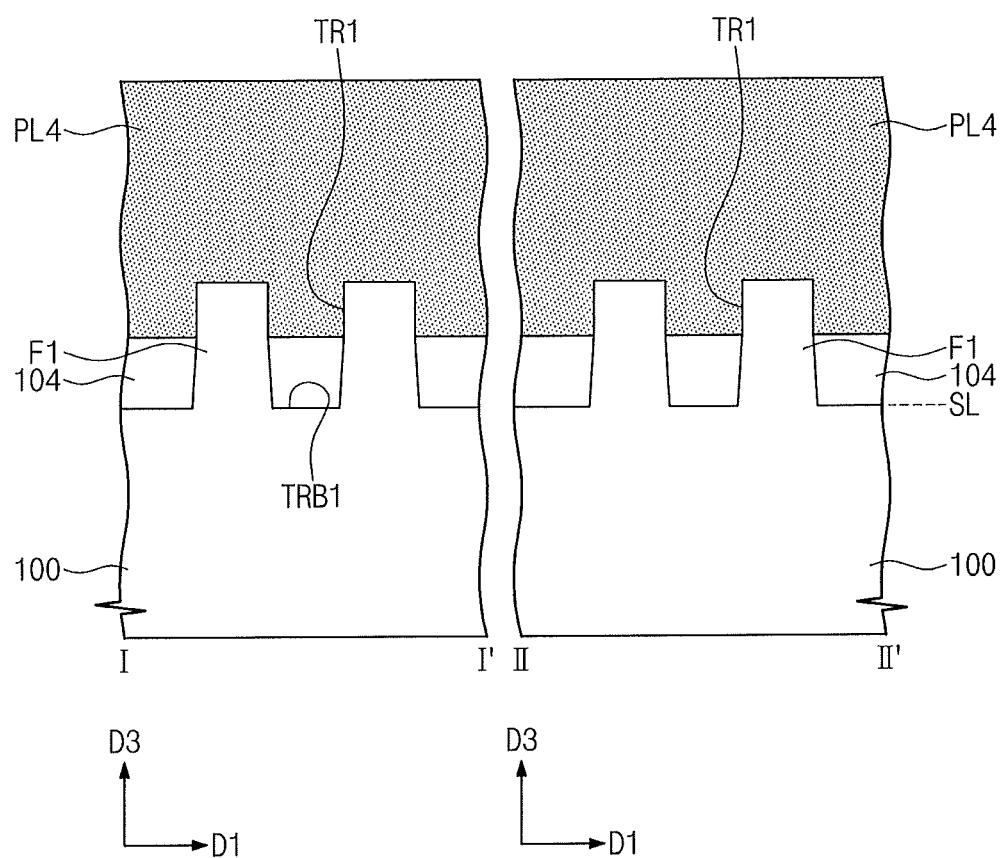
FIGS. 26A, 26B, 26C, and 26D are sectional views illustrating vertical sections taken along lines I-I', II-II', III-III', IV-IV', V-V', and VI-VI' of FIG. 25.
Figure 26B:
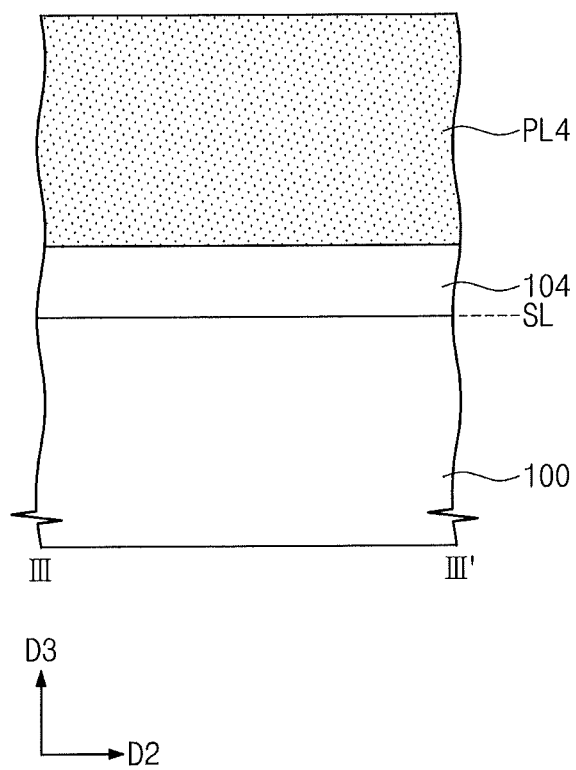
Figure 26C:
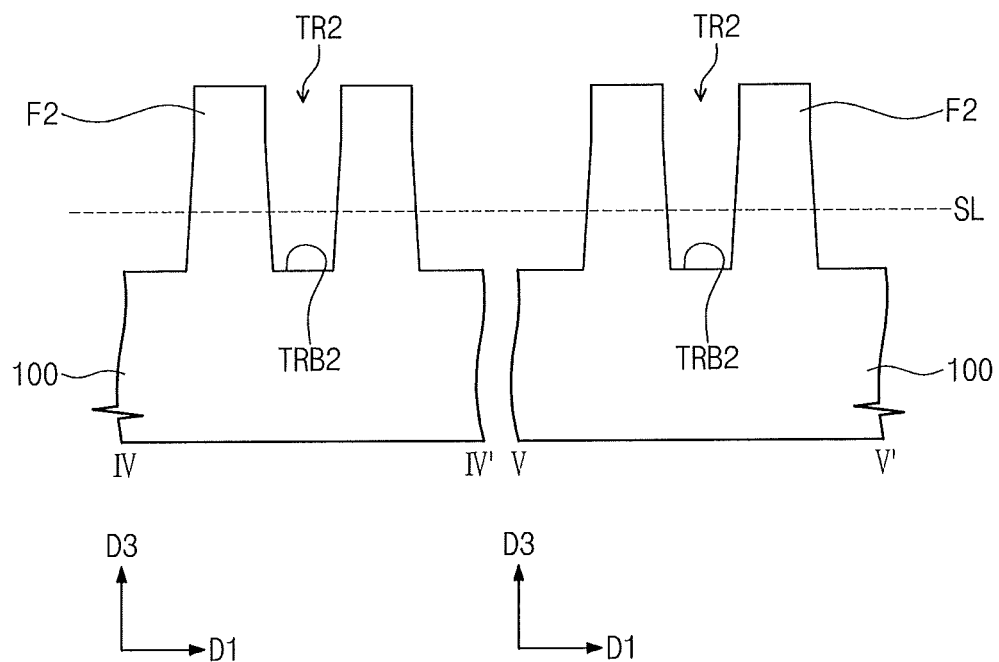
Figure 26D:
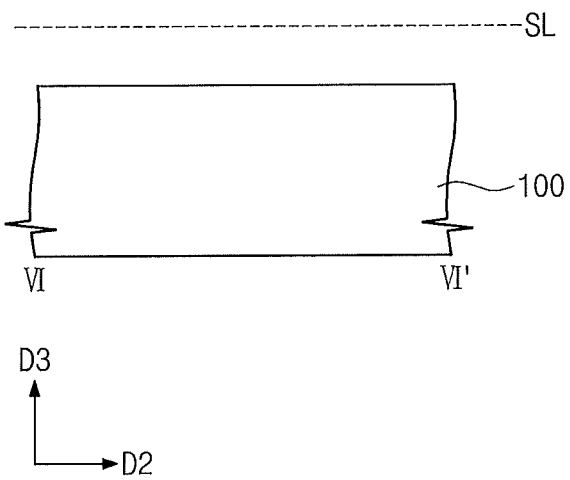

FIGS. 21, 23, and FIG. 25 are plan views illustrating a method of fabricating a semiconductor device according to example embodiments of the inventive concept. FIGS. 22A, 22B, 22C, and 22D are sectional views illustrating vertical sections taken along lines I-I', II-II', III-III', IV-IV', V-V', and VI-VI' of FIG. 21, FIGS. 24A, 24B, 24C, and 24D are sectional views illustrating vertical sections taken along lines I-I', II-II', III-III', IV-IV', V-V', and VI-VI' of FIG. 23, and FIGS. 26A, 26B, 26C, and 26D are sectional views illustrating vertical sections taken along lines I-I', II-II', III-III', IV-IV', V-V', and VI-VI' of FIG. 25. In the following description, an element or step previously described with reference to FIGS. 4 through 14 and FIGS. 16 through 19 may be identified by a similar or identical reference number without repeating an overlapping description thereof, for the sake of brevity.

Referring to FIGS. 21 and 22A through 22D, a third photoresist layer PL3 may be formed on the resulting structure described with reference to FIGS. 16, 17A, and 17B to cover the first region A. The third photoresist layer PL3 may cover all of the first active fins F1 of the first region A. The third photoresist layer PL3 may be formed to expose the second region B.

Thereafter, an upper portion of the substrate 100 on the second region B may be etched using the third photoresist layer PL3 and the first and second mask patterns 110 and 115 as an etch mask. Accordingly, the second trenches TR2 may be further etched to have the bottom surfaces TRB2 positioned at the second level SLb. The second level SLb may be lower than the reference level SL. In other words, the second trenches TR2 may be formed to be deeper than the first trenches TR1 of the first region A.

Referring to FIGS. 23 and 24A through 24D, the first and second mask patterns 110 and 115 may be removed, and an insulating layer may fill the first and second trenches TR1 and TR2. Thereafter, a wet etching process may be performed to recess the insulating layer and to form the device isolation layers 104 filling the first and second trenches TR1 and TR2. The top surfaces of the device isolation layers 104 of the first region A may be coplanar with the top surfaces of the device isolation layers 104 of the second region B.

Referring to FIGS. 25 and 26A through 26D, a fourth photoresist layer PL4 may be formed at the first region A to cover the first active fins F1 and the device isolation layers 104. The fourth photoresist layer PL4 may be formed to expose the second region B. Thereafter, the device isolation layers 104 in the second trenches TR2 may be completely removed using the fourth photoresist layer PL4 as an etch mask. The device isolation layers 104 in the first trenches TR1 may be protected by the fourth photoresist layer PL4. Accordingly, the device isolation layers 104 may remain in the first trenches TR1.

Thereafter, the process described with reference to FIGS. 8 through 14D may be performed to form gate structures on the first and second active fins F1 and F2.

According to example embodiments of the inventive concept, a semiconductor device may be provided in such a way that active fins on a fin capacitor region has a structure different from those on a fin field-effect-transistor region. A dielectric layer on the fin capacitor region may cover not only the active fins but also a top surface of a substrate positioned therebetween, and this may make it possible for the fin capacitors to have higher capacitance.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a first region and a second region;
first and second active fins at the first and second regions, respectively, of the substrate;
a device isolation layer in a first trench between the first active fins;
first and second gate electrodes that cross the first and second active fins, respectively;
a first dielectric layer between the first active fins and the first gate electrode to extend along the first gate electrode; and
a second dielectric layer between the second active fins and the second gate electrode to extend along the second gate electrode,
wherein the first dielectric layer is spaced apart from a bottom surface of the first trench by the device isolation layer between the bottom surface of the first trench and the first dielectric layer, and wherein the second dielectric layer is in direct contact with a bottom surface of a second trench between the second active fins.

2. The device of claim 1, wherein a top surface of the first dielectric layer on the first active fins is at substantially a same level as that of the second dielectric layer on the second active fins.

3. The device of claim 1, wherein the substrate comprises a shoulder portion positioned in the second region and between the second active fins, and wherein the shoulder portion has a top surface that is coplanar with a bottom surface of the second trench.

4. The device of claim 3, wherein the second dielectric layer covers top and side surfaces of at least one of the second active fins and a top surface of the shoulder portion.

5. The device of claim 1, wherein the first active fins, the first dielectric layer, and the first gate electrode constitute a transistor, and wherein the second active fins, the second dielectric layer, and the second gate electrode constitute a capacitor.

6. The device of claim 1, further comprising:
first source/drain patterns at both sides of the first gate electrode and in the first active fins; and
second source/drain patterns at both sides of the second gate electrode and in the second active fins.

7. The device of claim 6, further comprising:
an interlayered insulating layer covering the first and second active fins, the first and second source/drain patterns, and the first and second gate electrodes; and
a contact connected to at least one of the first source/drain patterns through the interlayered insulating layer.

8. The device of claim 1, wherein the bottom surface of the first trench is at a lower level than the bottom surface of the second trench.

9. The device of claim 1, wherein the bottom surface of the first trench is at the same level as the bottom surface of the second trench.

10. The device of claim 1, wherein the bottom surface of the first trench is positioned at a higher level than the bottom surface of the second trench.

11. A semiconductor device, comprising:
a substrate including first active fins, second active fins, first shoulder portions between the first active fins, and second shoulder portions between the second active fins;
first and second gate electrodes that cross the first and second active fins, respectively;
a first dielectric layer between the first active fins and the first gate electrode; and
a second dielectric layer between the second active fins and the second gate electrode,
wherein the first dielectric layer extends along the first gate electrode and is spaced apart from top surfaces of the first shoulder portions, and wherein the second dielectric layer extends along the second gate electrode to directly cover top surfaces of the second shoulder portions.

12. The device of claim 11, wherein a top surface of the first dielectric layer on the first active fins is at substantially a same level as a top surface of the second dielectric layer on the second active fins.

13. The device of claim 11, wherein the first active fins have a protruding structure between the first shoulder portions, wherein the second active fins have a protruding structure between the second shoulder portions, and wherein the first and second active fins are parallel to each other and have a line-shaped structure.

14. The device of claim 11, wherein the first shoulder portions are at substantially a same level as the second shoulder portions.

15. The device of claim 11, wherein the first shoulder portions are at a level different from the second shoulder portions.

16. A semiconductor device, comprising:
a substrate including a first region and a second region;
a plurality of first fins at the first region of the substrate;
a plurality of second fins at a second region of the substrate;
a plurality of first trenches between the first fins, the first trenches each having a bottom surface;
a plurality of second trenches between the second fins, the second trenches each having a bottom surface, wherein the bottom surfaces of the second trenches are at a different level from the bottom surfaces of the first trenches;
a device isolation layer that fills the first trenches;
first and second gate electrodes that cross the first and second active fins, respectively; and
a first dielectric layer between the second active fins and the second gate electrode,
wherein the first dielectric layer is in direct contact with the bottom surfaces of the second trenches.

17. The device of claim 16, further comprising a second dielectric layer between the first active fins and the first gate electrode,
wherein the second dielectric layer is spaced apart from bottom surfaces of the first trenches by the device isolation layer between the bottom surfaces of the first trenches and the first dielectric layer.

18. The device of claim 17, wherein a top surface of the second dielectric layer on the first active fins is at substantially a same level as that of the first dielectric layer on the second active fins.

19. The device of claim 16, wherein the substrate comprises a shoulder portion positioned in the second region and between the second active fins, and wherein the shoulder portion has a top surface that is coplanar with a bottom surface of the second trench.

20. The device of claim 16, wherein the first active fins are on PMOSFET region or NMOSFET region.

* * * * *